(12) United States Patent
Yasu

(10) Patent No.: US 12,306,345 B2
(45) Date of Patent: May 20, 2025

(54) DISTANCE MEASURING DEVICE

(71) Applicant: Sony Semiconductor Solutions Corporation, Kanagawa (JP)

(72) Inventor: Yohtaro Yasu, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 255 days.

(21) Appl. No.: 18/017,962

(22) PCT Filed: Sep. 3, 2021

(86) PCT No.: PCT/JP2021/032468
§ 371 (c)(1),
(2) Date: Jan. 25, 2023

(87) PCT Pub. No.: WO2022/059526
PCT Pub. Date: Mar. 24, 2022

(65) Prior Publication Data
US 2023/0266445 A1 Aug. 24, 2023

(30) Foreign Application Priority Data
Sep. 16, 2020 (JP) ................. 2020-155100

(51) Int. Cl.
*G01S 7/4863* (2020.01)
*G01S 7/481* (2006.01)
(Continued)

(52) U.S. Cl.
CPC .......... *G01S 7/4863* (2013.01); *G01S 7/4816* (2013.01); *G01S 17/894* (2020.01); *H04N 25/40* (2023.01);
(Continued)

(58) Field of Classification Search
None
See application file for complete search history.

(56) References Cited

U.S. PATENT DOCUMENTS 10,257,455 B2 * 4/2019 Lin ................. G01S 17/89
2020/0041258 A1 * 2/2020 Wang .............. G06T 7/521
2022/0408048 A1 * 12/2022 Higashi ............ H04N 25/78

FOREIGN PATENT DOCUMENTS

JP 2008236787 A 10/2008
JP 2009130215 A 6/2009
(Continued)

OTHER PUBLICATIONS

International Search Report (PCT/ISA/210), International Application No. PCT/JP2021/032468, dated Nov. 22, 2021.

*Primary Examiner* — Chikaodili E Anyikire
(74) *Attorney, Agent, or Firm* — Michael Best & Friedrich LLP

(57) ABSTRACT

A distance measuring device (500) including a plurality of pixels (11a, 12a) provided in a row direction and a column direction, a plurality of AD conversion circuits (6, 7) provided in the row direction, each of the plurality of AD conversion circuits performing AD conversion on pixel signals of a corresponding column, and a signal processing section (92) that generates a depth image signal based on conversion results of the plurality of AD conversion circuits, wherein the plurality of pixels (11a, 12a) include a plurality of valid pixels (11a) provided in the row direction and the column direction to correspond to the depth image signal, each of the valid pixels including a plurality of charge transfer sections (TA, TB) that extract pixel signals corresponding to a light amount of incident light in different periods, and a plurality of light-shielded pixels (12a) provided in the column direction on at least one of two end sides in the row direction with respect to a region provided with the plurality of valid pixels (11a), each of the plurality of light-shielded pixels being covered with a light-shielding film (M).

12 Claims, 29 Drawing Sheets

(51) Int. Cl.
*G01S 17/894* (2020.01)
*H04N 25/40* (2023.01)
*H04N 25/705* (2023.01)
*H04N 25/78* (2023.01)
*H04N 25/79* (2023.01)
*H10F 39/00* (2025.01)
*H10F 39/18* (2025.01)
*G02B 1/11* (2015.01)
*G02B 3/00* (2006.01)

(52) U.S. Cl.
CPC ........... *H04N 25/705* (2023.01); *H04N 25/78* (2023.01); *H04N 25/79* (2023.01); *H10F 39/1843* (2025.01); *H10F 39/805* (2025.01); *H10F 39/8057* (2025.01); *H10F 39/8063* (2025.01); *G02B 1/11* (2013.01); *G02B 3/0043* (2013.01)

(56) References Cited

FOREIGN PATENT DOCUMENTS

| | | | |
|---|---|---|---|
| JP | 2019068351 | A | 4/2019 |
| JP | 2019096914 | A | 6/2019 |
| JP | 2019125784 | A | 7/2019 |
| JP | 2020005096 | A | 1/2020 |
| WO | 2020017340 | A1 | 1/2020 |

\* cited by examiner

FIG.12
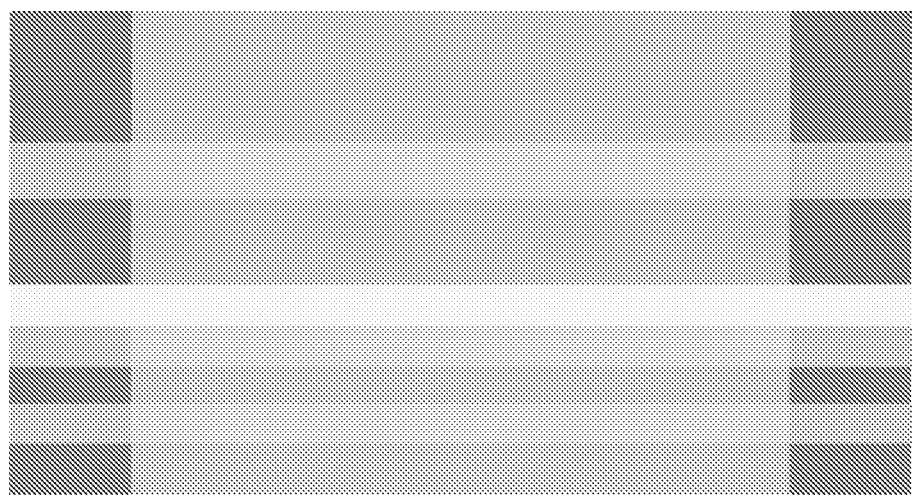
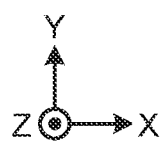

FIG.21
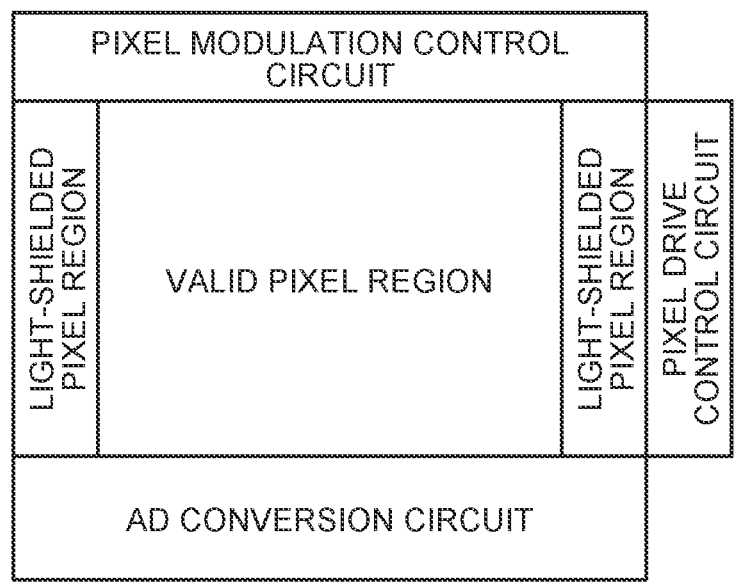
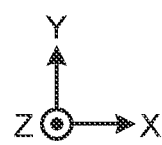
FIG.22
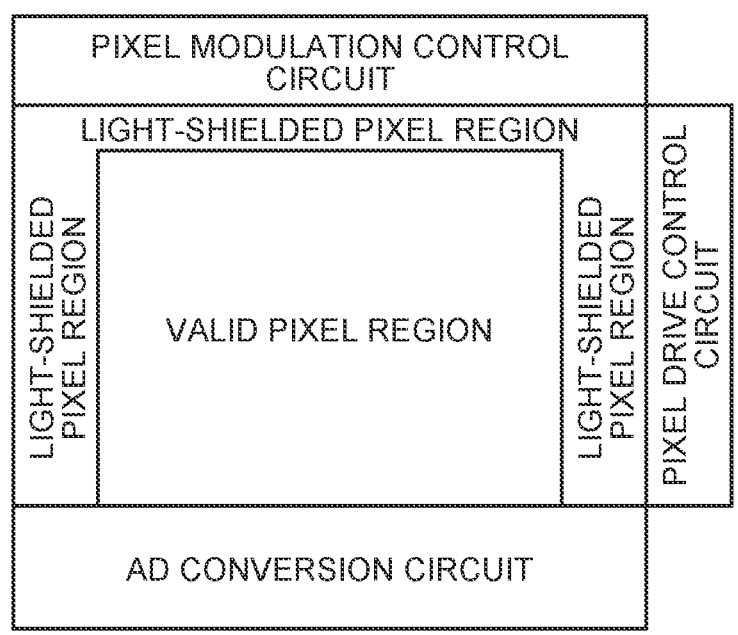
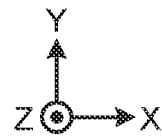

DISTANCE MEASURING DEVICE

FIELD

The present disclosure relates to a distance measuring device.

BACKGROUND

Patent Literature 1 discloses a distance measuring device that generates a depth image signal using an indirect time of flight (ToF) method. The distance measuring device includes a plurality of pixels provided in a row direction and a column direction, and a plurality of AD conversion circuits provided in the row direction. Each of the plurality of AD conversion circuits performs AD conversion on pixel signals in the same column.

CITATION LIST

Patent Literature

Patent Literature 1: JP 2020-5096 A

SUMMARY

Technical Problem

In a depth image, display variation in a vertical direction (the column direction of pixels) may occur. An example of the cause is that the magnitude of the voltage drop generated until a pixel signal reaches the AD conversion circuit is different for each row.

According to an aspect or the present disclosure, there is provided a distance measuring device capable of inhibiting display variation in the vertical direction.

Solution to Problem

A distance measuring device according to one aspect of the present disclosure comprises: a plurality of pixels provided in a row direction and a column direction; a plurality of AD conversion circuits provided in the row direction, each of the plurality of AD conversion circuits performing AD conversion on pixel signals of a corresponding column; and a signal processing section that generates a depth image signal based on conversion results of the plurality of AD conversion circuits, wherein the plurality of pixels include: a plurality of valid pixels provided in the row direction and the column direction to correspond to the depth image signal, each of the valid pixels including a plurality of charge transfer sections that extract pixel signals corresponding to a light amount of incident light in different periods; and a plurality of light-shielded pixels provided in the column direction on at least one of two end sides in the row direction with respect to a region provided with the plurality of valid pixels, each of the plurality of light-shielded pixels being covered with a light-shielding film.

BRIEF DESCRIPTION OF DRAWINGS

FIG. 12 is a diagram depicting an example of display variation in the vertical direction due to PSRR.

FIG. 21 is a diagram depicting a layout example of the light receiving section.

FIG. 22 is a diagram depicting a layout example of the light receiving section.

DESCRIPTION OF EMBODIMENTS

Hereinafter, embodiments of the present disclosure will be described in detail with reference to the drawings. In each of the following embodiments, the same portions are denoted by the same reference signs, and repetitive description will be omitted.

Figure 1:
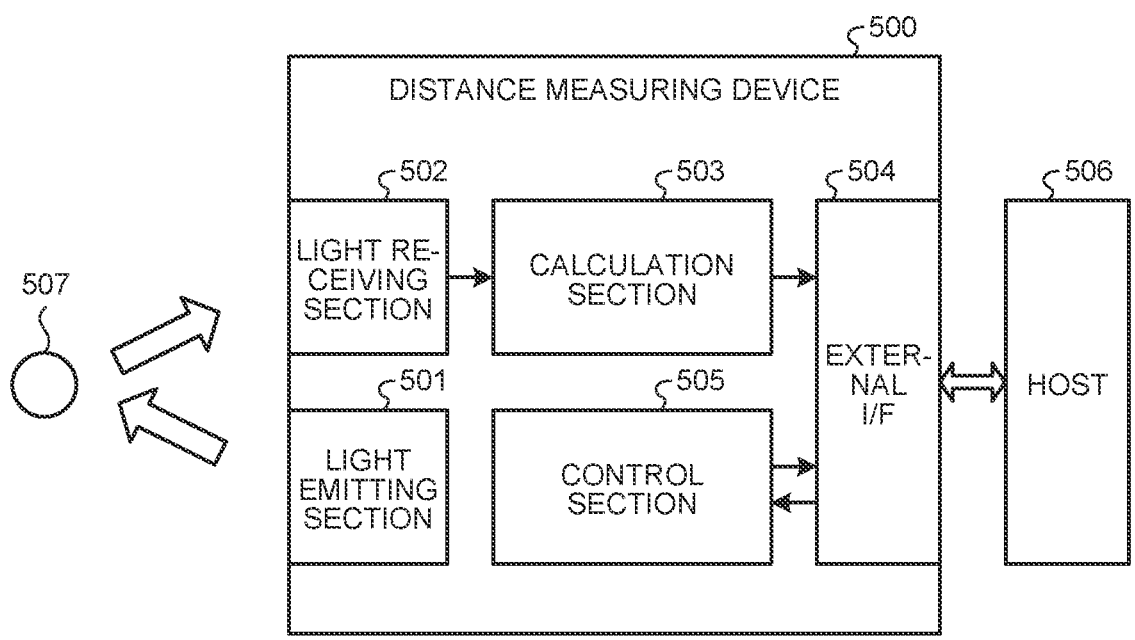
FIG. 1 is a perspective view depicting an example of a schematic configuration of a distance measuring device according to an embodiment.

The present disclosure will be described according to the following item order.
1. Embodiment
2. Modifications
2.1 Example of Schematic Configuration of Pixel
2.2 Example of Layout of Light Receiving Section
2.3 Example of Stacked Structure
3. Application Exam-ole to Mobile Body
4. Effects 1. Embodiment FIG. 1 is a perspective view depicting an example of a schematic configuration of a distance measuring device according to an embodiment. In this example, a distance measuring device 500 is an indirect ToF sensor (distance measuring sensor that measures a distance to an object 507. The distance measuring device 500 includes a light emitting section 501, a light receiving section 502, a calculation section 503, an external I/F 504, and a control section 505.

The light emitting section 501 emits laser light (for example, infrared light) at a predetermined cycle. The emitted laser light is schematically indicated by the outlined arrows. The laser light is emitted in an angle range equal to or larger than the angle of view of the light receiving section 502. The laser light is a pulsed laser having a predetermined time width, and examples of the light source include a semiconductor laser diode. In the example depicted in FIG. 1, the laser light is reflected by the object 507. The reflected laser light enters the light receiving section 502. The light receiving section 502 includes a plurality of pixels arranged in a matrix and outputs a depth image signal generated based on pixel signals of the pixels. Details of the light receiving section 502 will be described later again with reference to FIG. 2 and subsequent drawings.

The calculation section 503 generates a depth image (in this example, a depth image including the object 507) from the depth image signal output from the light receiving section 502. The generation of the depth image may include processing such as noise removal. The generated depth image may be output to a host 506 outside the distance measuring device 500 via the external I/F 504. The external I/F 504 is, for example, a communication adapter for securing communication with the host 506. The control section 505 controls each element of the distance measuring device 500. The control section 505 may include a CPU and the like. Examples of the host 506 include a controller provided in an external device on which the distance measuring device 500 is mounted. Examples of the external device include a vehicle, and in this case, the host 506 may be an engine control unit (ECU).

Figure 2:
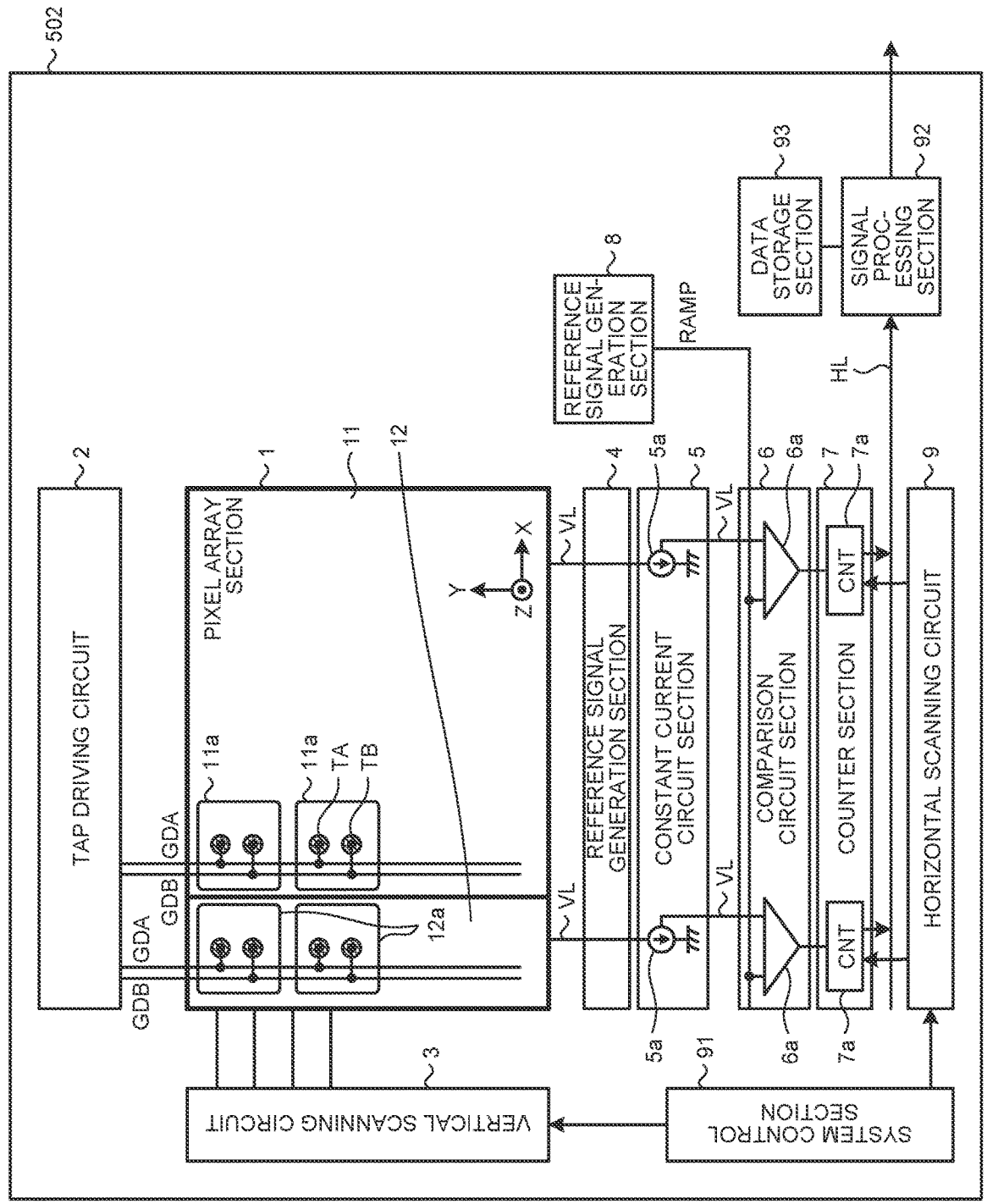
FIG. 2 is a diagram depicting an example of a schematic configuration of a light receiving section.

FIG. 2 is a diagram depicting an example of a schematic configuration of the light receiving section. The light receiving section 502 includes a pixel array section 1, a tap driving circuit 2, a vertical scanning circuit 3, a reference signal generation section 4, a constant current circuit section 5, a comparison circuit section 6, a counter section 7, a reference signal generation section 8, a horizontal scanning circuit 9, a system control section 91, a signal processing section 92, and a data storage section 93. A coordinate system in which a row direction is an X-axis direction and a column direction is a Y-axis direction is also depicted for the pixel array section 1. The row direction and the column direction correspond to the vertical direction and the lateral direction of the depth image.

The pixel array section 1 includes a plurality of pixels provided in the row direction and the column direction. As the plurality of pixels, some of a plurality of valid pixels 11a and some of a plurality of light-shielded pixels 12a are illustrated. A region where the valid pixels 11a are provided is referred to as a region 11 in the drawing. A region where the light-shielded pixels 12a are provided is referred to as a region 12 in the drawing.

The plurality of valid pixels 11a are provided in the row direction and the column direction to correspond to (the pixels of) the depth image signal. The valid pixel 11a is a pixel whose pixel signal is effectively used as a pixel signal that is a base of the depth image signal. In the example depicted in FIG. 2, the region 11 has a length in the row direction longer than a length in the column direction (landscape-oriented aspect ratio), and thus, the depth image may also have a landscape-oriented aspect ratio.

The plurality of light-shielded pixels 12a are provided in the column direction on at least one of two end sides in the row direction with respect to the region 11 where the plurality of valid pixels 11a are provided. In this example, the plurality of light-shielded pixels 12a are provided only on one side (X-axis negative direction side). In one embodiment, the light-shielded pixel 12a has the same structure as the valid pixel 11a except that it is shielded from light. As a result, a pixel signal obtained in a case where the valid pixel 11a is shielded from light is obtained from the light-shielded pixel 12a.

The valid pixel 11a and the light-shielded pixel 12a output voltage signals corresponding to the amount of incident light as pixel signals. The amount of incident light of the light-shielded pixel 12a is the amount of light after light shielding. The pixel signals appear in a vertical signal line VL extending in the column direction. In FIG. 2, a part of vertical signal line VL provided corresponding to each column is illustrated.

To realize the indirect ToF method, each pixel includes a plurality of charge transfer sections that extract pixel signals according to the amount of incident light in mutually different periods. Hereinafter, the charge transfer section is also referred to as "tap". A tap TA and a tap TB will be described as an example of the plurality of taps. A voltage GDA and a voltage GDB are applied to the tap TA and the tap TB.

Figure 3:
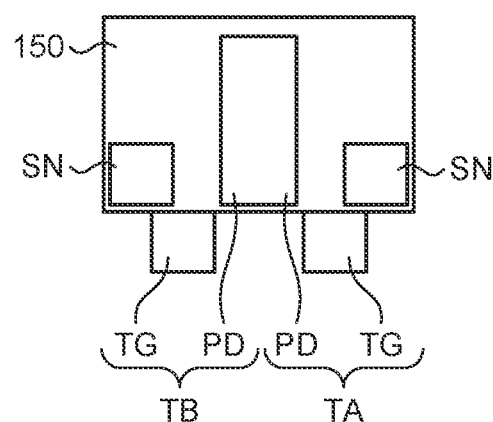
FIG. 3 is a diagram depicting an example of a schematic configuration of taps.

FIG. 3 is a diagram depicting an example of a schematic configuration of the taps. Two transfer gates TG, a photoelectric conversion section PD formed on a semiconductor substrate 150, and two storage nodes SN are illustrated. In this example, each of the tap TA and the tap TB transfers the charge generated and accumulated in the photoelectric conversion section PD to the corresponding storage node SN via the corresponding transfer gate TG.

The voltage GDA is applied to the transfer gate TG of the tap TA. The voltage GDB is applied to the transfer gate TG of the tap TB.

The voltage GDA and the voltage GDB are mutually exclusive voltages, and are, for example, voltages modulated such that a state (state A) in which the voltage GDA is 1.5 V and the voltage GDB is 0 V and a state (state B) in which the voltage GDA is 0 V and the voltage GDB is 1.5 V are repeated. During the period in which the state A is maintained, pixel signals are extracted via the tap TA. During the period in which the state B is maintained, pixel signals are extracted via the tap TB. In this manner, pixel signals corresponding to the amounts of incident light in different periods are extracted.

Figure 4:
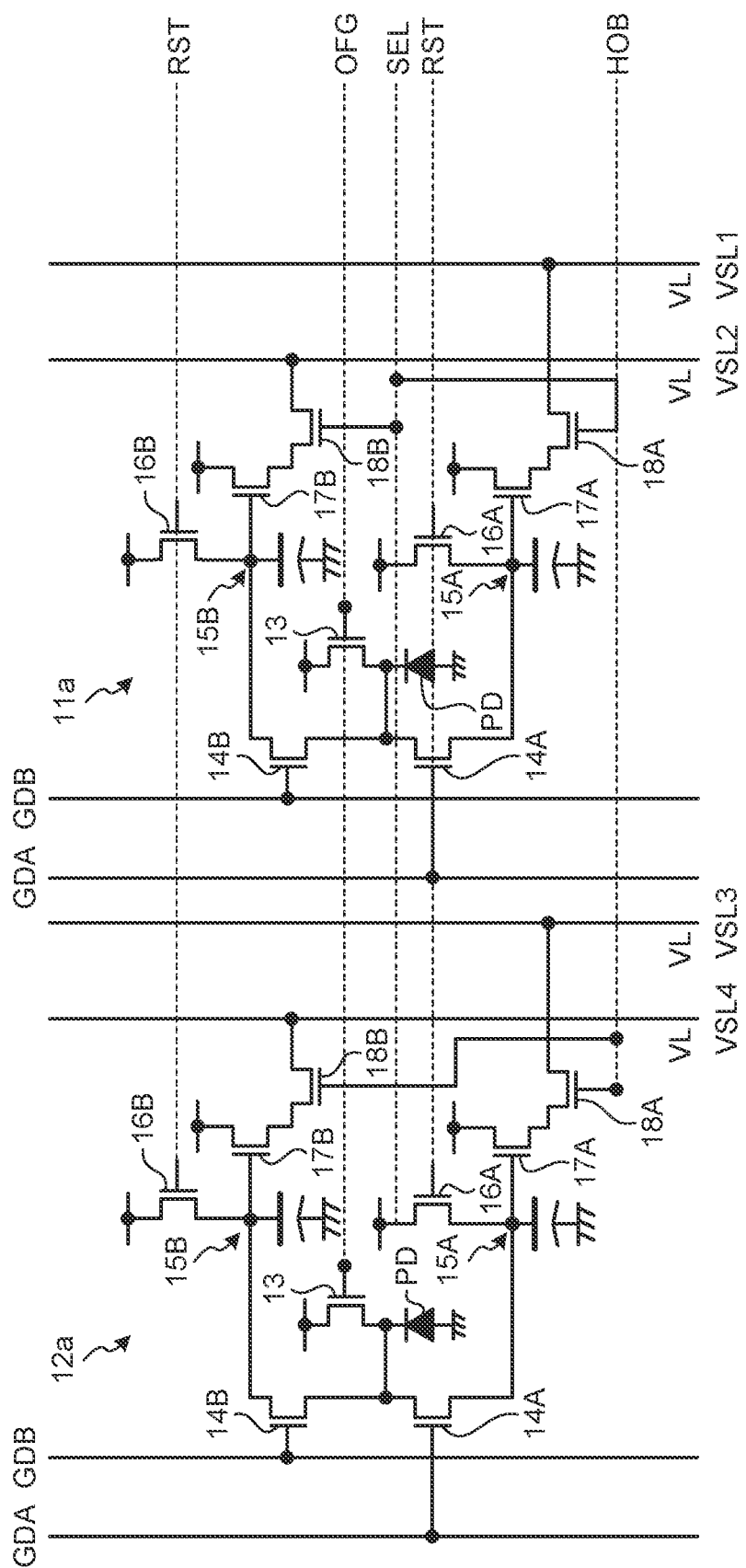
FIG. 4 is a diagram depicting an example of an equivalent circuit of pixels.

FIG. 4 is a diagram depicting an example of an equivalent circuit of pixels. Hereinafter, the valid pixel 11a will be mainly described, and regarding the light-shielded pixel 12a, only different portions will be described.

As depicted on the right side of FIG. 4, the valid pixel 11a includes a photoelectric conversion section PD, a discharge transistor 13, a transfer transistor 14, an accumulation section 15, a reset transistor 16, an amplification transistor 17, and a selection transistor 18. Among them, the transfer transistor 14, the accumulation section 15, the reset transistor 16, and the amplification transistor 17 are provided for each of the tap TA and the tap TB described above. The transfer transistor 14 and the like provided for the tap TA are referred to as a transfer transistor 14A and the like in the drawing. The transfer transistor 14 and the like provided for the tap TB are referred to as a transfer transistor 14B and the like in the drawing.

The photoelectric conversion section PD is a portion that generates and accumulates charges according to the amount of incident light, and it corresponds to the photoelectric conversion section PD of the tap TA and the tap TB in FIG. 3 described above. The photoelectric conversion section PD may be an aspect of photodiode.

The discharge transistor 13 is an overflow gate that discharges the charges of the photoelectric conversion section PD. The discharge transistor 13 is connected between the photoelectric conversion section PD and a reference potential (for example, a power supply voltage). The control signal applied to the gate of the discharge transistor 13 is referred to as a discharge signal OFG in the drawing.

The transfer transistor 14A is provided between the photoelectric conversion section PD and the accumulation section 15A, and it transfers the charges of the photoelectric conversion section PD to the accumulation section 15A. The transfer transistor 14A corresponds to the transfer gate TG in the tap TA in FIG. 3 described above. The drive signal applied to the gate of the transfer transistor 14A is the voltage GDA described above. The transfer transistor 14B is provided between the photoelectric conversion section PD and the accumulation section 15B, and it transfers the charges of the photoelectric conversion section PD to the accumulation section 15B. The transfer transistor 14B corresponds to the transfer gate TG in the tap TA in FIG. 3 described above. The drive signal applied to the gate of the transfer transistor 14B is the voltage GDB described above.

The accumulation section 15A is a floating diffusion that accumulates the charges transferred from the photoelectric conversion section PD via the transfer transistor 14A. The accumulation section 15A corresponds to the storage node SN corresponding to the tap TA in FIG. 3 described above. The accumulation section 15B is a floating diffusion that accumulates the charges transferred from the photoelectric conversion section PD via the transfer transistor 14B. The accumulation section 15B corresponds to the storage node SN corresponding to the tap TB in FIG. 3 described above. The accumulation section 15A and the accumulation section 15B may be formed of, for example, an n-type region or may be formed of a capacitor using metal or the like.

The reset transistor 16A is provided between the accumulation section 15A and the reference potential, and it resets the accumulation section 15A. The reset transistor 16B is provided between the accumulation section FB and the reference potential, and it resets the accumulation section 15B. The control signal applied to the gates of the reset transistor 16A and the reset transistor 16B is referred to as a reset signal RST in the drawing.

The amplification transistor 17A outputs a voltage signal corresponding to the charges accumulated in the accumulation section 15A. The amplification transistor 17B outputs a voltage signal corresponding to the charges accumulated in the accumulation section 15B.

The selection transistor 18A is provided between the amplification transistor 17A and the vertical signal line VL, and it causes the voltage signal output from the amplification transistor 17A to appear in the vertical signal line VL as a pixel signal VSL1. The selection transistor 18B is provided between the amplification transistor 17B and the vertical signal line VL, and it causes the voltage signal output from the amplification transistor 17B to appear in the vertical signal line VL as a pixel signal VSL2.

The discharge transistor 13, the transfer transistor 14, the reset transistor 16, the amplification transistor 17, the selection transistor 18, and the like controlled by the above-described control signals are referred to as readout circuits.

The above-described configuration is merely an example of an equivalent circuit of pixels, and various other circuit configurations may be adopted. For example, a memory section that temporarily holds the charges generated in the photoelectric conversion section PD before the charges are transferred to the accumulation section 15 may be provided between the transfer transistor 14 and the accumulation section 15. In such a case, another transfer transistor that causes the memory section to hold charges and transfers the charges to the accumulation section 15 may be provided. Providing the memory section enables an operation in a global shutter system in which exposure is performed so that the timings of the start and end of exposure of all pixels are matched.

In this example, the light-shielded pixel 12a depicted on the left side of FIG. 4 has the same structure as the valid pixel 11a. Note that, the control signal applied to the selection transistor 18A and the selection transistor 18B of the light-shielded pixel 12a is referred to as a pixel selection signal HOB in the drawing. The pixel signal that appears in the vertical signal line VL via the selection transistor 18A is referred to as a pixel signal VSL3 in the drawing. The pixel signal that appears in the vertical signal line VL via the selection transistor 18B is referred to as a pixel signal VSL4 in the drawing.

Returning to FIG. 2, the tap driving circuit 2 is a pixel modulation control circuit that, generates a modulation signal for controlling extraction of pixel signals by the tap TA and the tap TB of each of the plurality of valid pixels 11a and each of the plurality of light-shielded pixels 12a. Specifically, the tap driving circuit 2 generates the above-described voltage GDA and voltage GDB and supplies the generated voltages to the tap TA and the tap TB. The tap driving circuit 2 is provided in the row direction on at least one of two end sides in the column direction with respect to the region 11 where the plurality of valid pixels 11a are provided. In this example, the tap driving circuit 2 is provided on one side (Y-axis positive direction side).

The vertical scanning circuit collectively drives the plurality of valid pixels 11a and the plurality of pixels 21a in units of rows. Examples of the control signal used for driving include the discharge signal OFG, the reset signal RST, the pixel selection signal SEL, and the pixel selection signal HOB described above with reference to FIG. 4. Since a method of pixel driving for each row using these control signals is known, a detailed description thereof will not be given. The vertical scanning circuit 3 includes a shift register, an address decoder, and the like.

The reference signal generation section 4 generates a reference signal that can be used as a zero reset signal used for an auto-zero operation of the comparison circuit section 6. The constant current circuit section 5 includes a plurality of current sources 5a each connected to the corresponding vertical signal line VL. Since there is a case where the reference signal generated by the reference signal generation section 4 is not used, the reference signal generation section 4 and the constant current circuit section 5 do not have to be provided.

The comparison circuit section 6 compares a signal appearing in the vertical signal line VL with a reference signal RAMP (described later). The comparison circuit section 6 includes a plurality of comparison circuits 6a each connected to the corresponding vertical signal line VL. The counter section 7 includes a plurality of counters 7a each connected to the corresponding comparison circuit 6a. Each counter 7a constitutes an AD conversion circuit together with the corresponding comparison circuit 6a. That is, the comparison circuit section 6 and the counter section 7 are provided in the row direction and constitute a plurality of AD conversion circuits that perform AD conversion on the pixel signals of the corresponding columns.

The reference signal generation section 8 generates the reference signal RAMP. The reference signal RAMP is a signal whose level gradually changes with the lapse of time, and is, for example, a signal whose voltage decreases with the lapse of time.

The horizontal scanning circuit 9 sequentially selects the counters 7a of the counter section 7 and outputs the AD-converted pixel signals (conversion results of the plurality of AD conversion circuits) temporarily held in the counters 7a to the signal processing section 92 via the horizontal signal line HL.

The vertical scanning circuit 3 and the horizontal scanning circuit 9 described above constitute a pixel control driver that generates a control signal for reading out the pixel signal of each of the plurality of valid pixels 11a and each of the plurality of light-shielded pixels 12a.

The system control section 91 drives and controls the reference signal generation section 4, the constant current circuit section 5, the comparison circuit section 6, the counter section 7, and the like. The system control section 91 includes a timing generator and the like.

The signal processing section 92 generates a depth image signal based on the conversion results of the plurality of AD conversion circuits. For example, the signal processing section 92 generates an image based on the pixel signal after AD conversion. In this process, the signal processing section 92 calculates distance information corresponding to the pixel based on the pixel signal of the tap TA and the pixel signal of the tap TB of the same valid pixel 11a (for example, their difference) and associates the distance information with the generated image signal. Examples of the distance information include a depth value.

The data storage section 93 temporarily stores data necessary for the processing of the signal processing section 92.

The pixel array section 1 will be described again. In the pixel array section 1, an invalid pixel that is not connected to the AD conversion circuit may be provided between the valid pixel 11a and the light-shielded pixel 12a. The light-shielding function in the light-shielded pixel 12a can be enhanced by separating the light-shielded pixel 12a from the valid pixel 11a by the amount of the invalid pixel provided. The invalid pixel may have a structure that absorbs a structural difference between the structure of the valid pixel 11a and the structure of the light-shielded pixel 12a. Such a region where the invalid pixel is provided forms a buffer region between the valid pixel 11a and the light-shielded pixel 12a. An example of the configuration of the valid pixel 11a, the light-shielded pixel 12a, and the invalid pixel will be described with reference to FIG. 5.

Figure 5:
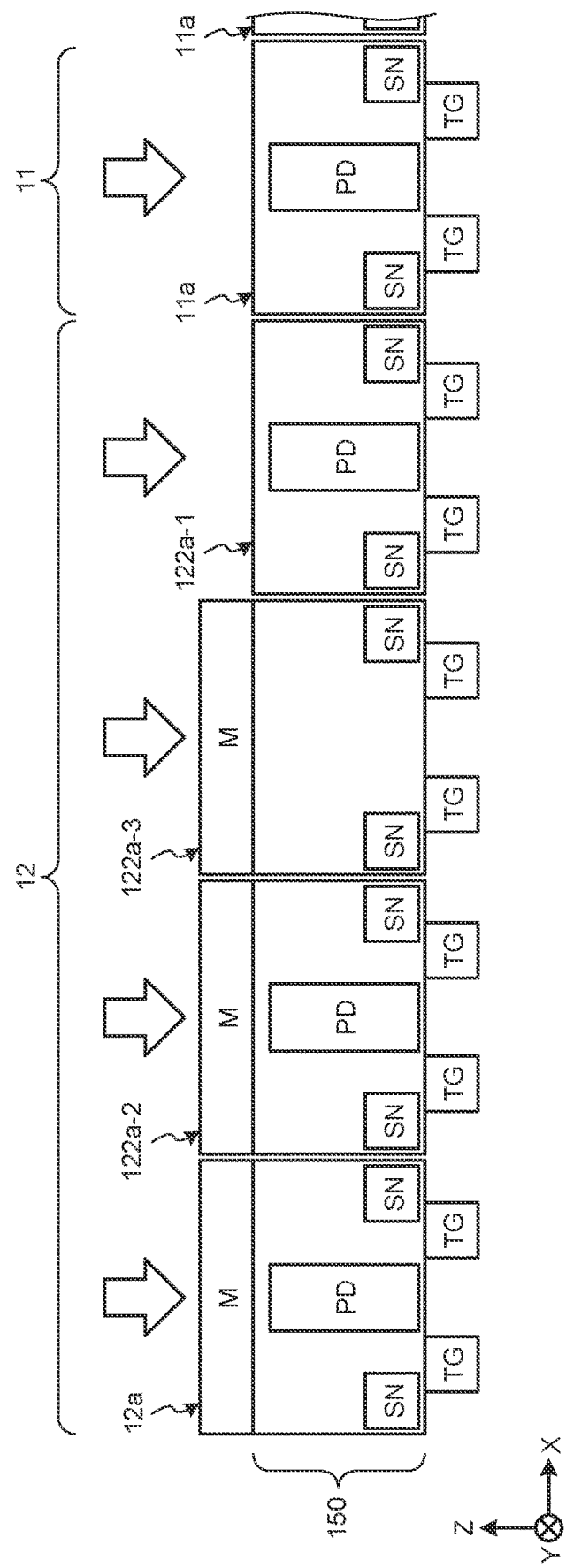
FIG. 5 is a diagram depicting an example of a schematic configuration of pixels.

FIG. 5 is a diagram depicting an example of a schematic configuration of pixels. FIG. 5 schematically depicts a configuration in which a part of pixels in the same row is viewed from a side (viewed in the Y-axis positive direction). The white arrows in the drawing schematically indicate incident light. In this example, the pixels are back-illuminated pixels in which incident light enters a surface of the semiconductor substrate 150 opposite to the surface on which a transfer gate TG (described later) and the like are provided. In addition to the valid pixel 11a being provided in the region 11 and the light-shielded pixel 12a being provided in the region 12 as described above, an invalid pixel 122a-1, an invalid pixel 122a-2, and an invalid pixel 122a-3 are provided in the region 12.

As the constituent elements of the valid pixel 11a, the photoelectric conversion section PD, two storage nodes SN, and two transfer gates TG are illustrated. The light-shielded pixel 12a has a structure in which a light-shielding film M is provided in the structure of the valid pixel 11a. The light-shielding film M is provided to cover the photoelectric conversion section PD, thereby shielding the photoelectric conversion section PD from light. Examples of the light-shielding film M include a metal film.

The invalid pixel 122a-1, the invalid pixel 122a-2, and the invalid pixel 122a-3 are pixels that are not connected to the AD conversion circuit as described above, and they are realized, for example, by not providing a contact for extracting pixel signals. The invalid pixel 122a-1 is a first invalid pixel provided adjacent to the valid pixel 11a. In this example, the invalid pixel 122a-1 has the same structure as the valid pixel 11a. The invalid pixel 122a-2 is a second invalid pixel provided adjacent to the light-shielded pixel 12a. In this example, the invalid pixel 122a-2 has the same structure as the light-shielded pixel 12a. The invalid pixel 122a-3 is a third invalid pixel provided between the invalid pixel 122a-1 and the invalid pixel 122a-2. The invalid pixel 122a-3 has a structure excluding the photoelectric conversion section PD from the structure of the light-shielded pixel 12a. For example, by providing the invalid pixel 122a-1, the invalid pixel 122a-3, and the invalid pixel 122a-3 in this order from the valid pixel 11a toward the light-shielded pixel 12a, it is possible to absorb the structural difference between the structure of the valid pixel 11a and the structure of the light-shielded pixel 12a.

The number of invalid pixels provided in the row direction is not limited to three. The structure of the invalid pixels is not limited to the example depicted in FIG. 5. Some other examples are described below with reference to FIGS. 13 to 20.

Figure 6:
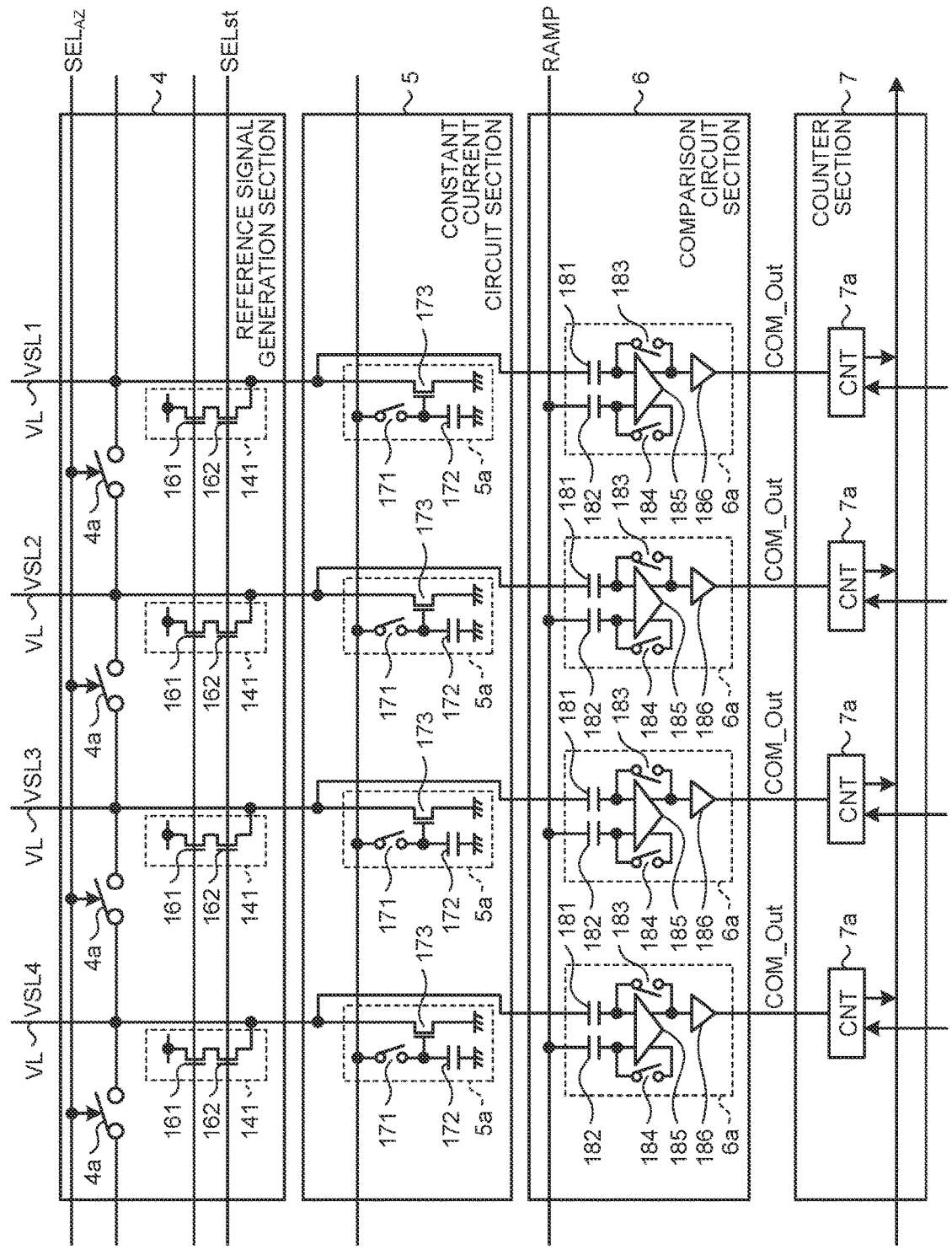
FIG. 6 is a diagram depicting an example of an equivalent circuit of a reference signal generation section to a counter section.

FIG. 6 is a diagram depicting an example of an equivalent circuit of a reference signal generation section to a counter section. Unless otherwise specified, control signals for switches, transistors, and the like are supplied from the system control section 91. Some control signals have reference signs.

The reference signal generation section 4 generates a zero reset signal used for an auto-zero operation of the comparison circuit section 6. As the zero reset signal, either the pixel signal of the light-shielded pixel 12a (in this example, the pixel signal VSL3 or the pixel signal VSL4) or a given reference signal may be used. Thus, the reference signal generation section 4 includes a plurality of reference signal generation circuits 141 and a plurality of switches 4a.

The reference signal generation circuit 141 is connected to the corresponding vertical signal line VL. The reference signal generation circuit 141 includes an amplification transistor 161 and a selection transistor 162 connected in series. The amplification transistor 161 constitutes a source follower together with the current source 5a. The source of the amplification transistor 161 is connected to the vertical signal line VL via the selection transistor 162. The selection transistor 162 causes the reference signal output from the amplification transistor 161 to appear in the vertical signal line VL according to a pixel selection signal SELst input to the gate. The selection transistor 162 is connected between the source of the amplification transistor 161 and the vertical signal line VL.

The switches 4a are connected between the vertical signal lines VL adjacent to each other. When the pixel signal of the light-shielded pixel 12a appears in the corresponding vertical signal line VL in a state where the switch 4a is turned on, the same pixel signal also appears in other vertical signal lines VL. These pixel signals are used for the auto-zero operation of the comparison circuit section 6. When each of the plurality of reference signal generation circuits 141 generates a reference signal in a state where the plurality of switches 4a are turned off, the reference signal appears on the corresponding vertical signal line VL. These reference signals are used for the auto-zero operation of the comparison circuit section 6. The control signals of the plurality of switches 4a are referred to as selection control signals $SEL_{AZ}$ in the drawing.

The constant current circuit section 5 includes a plurality of current sources 5a each connected to the corresponding vertical signal line VL. As described above, the current source 5a constitutes the source follower. The current source 5a includes a switch 171, a capacitor (capacitive element) 172, and a load transistor 173. Predetermined charges are accumulated in the capacitor 172 via the switch 171. A predetermined voltage corresponding to the accumulated charges is applied to the gate of the load transistor 173, and a current flows between the drain and the source of the load transistor 173.

The comparison circuit section 6 includes a plurality of comparison circuits 6a each connected to the corresponding vertical signal line VL. Each comparison circuit 6a compares the voltage signal of the vertical signal line VL with the reference signal RAMP. The comparison circuit 6a includes a capacitor (capacitive element) 181, a capacitor 182, a switch 183, a switch 184, a comparator 185, and a sense amplifier 186. The comparison result of the comparator 185 is output as a comparison result signal COM_Out via the sense amplifier 186 and is counted by the corresponding counter 7a.

The voltage signal of the vertical signal line VL is input to one input terminal (first input terminal) of the comparator 185 via the capacitor 181. The reference signal RAMP is input to the other input terminal (second input terminal) of the comparator 185 via the capacitor 182. The switch 183 is connected between the first input terminal and the output terminal of the comparator 185. The switch 184 is connected between the second input terminal and the output terminal of the comparator 185.

During the auto-zero operation, the zero reset signal is input to the first input terminal of the comparator 185, and the reference signal RAMP is input to the second input terminal. The switch 183 and the switch 184 are turned on, and the capacitor 181 and the capacitor 182 are charged such that the voltage of the first input terminal and the voltage of the second input terminal of the comparator 185 become equal (to transition to the same voltage).

At the time of the subsequent counting operation, the pixel signal is input to the first input terminal of the comparator 185 and is compared with the reference signal RAMP input to the second input terminal again. The comparison result signal COM_Out outputs Hi (High) until the signal level of the reference signal RAMMP becomes the signal level of the pixel signal.

The counter section 7 includes a plurality of counters 7a connected to the corresponding vertical signal lines VL. Each counter 7a counts up while the above-described comparison result signal COM_Out outputs Hi. The count value is the pixel signal after AD conversion, that is, an AD conversion result of the pixel signal.

As described above, either the pixel signal of the light-shielded pixel 12a or the reference signal of the reference signal generation circuit 141 may be used as the zero reset signal. When the pixel signal of the light-shielded pixel 12a is used as the zero reset signal, the comparison circuit section 6 (plurality of comparison circuits 6a) performs an auto-zero operation using, as the zero reset signal, the pixel signal of the light-shielded pixel 12a in the same row as the valid pixel 11a from which the pixel signal to be compared with the reference signal RAMP is acquired. This configuration will be described with reference to FIGS. 7 and 8.

Figure 7:
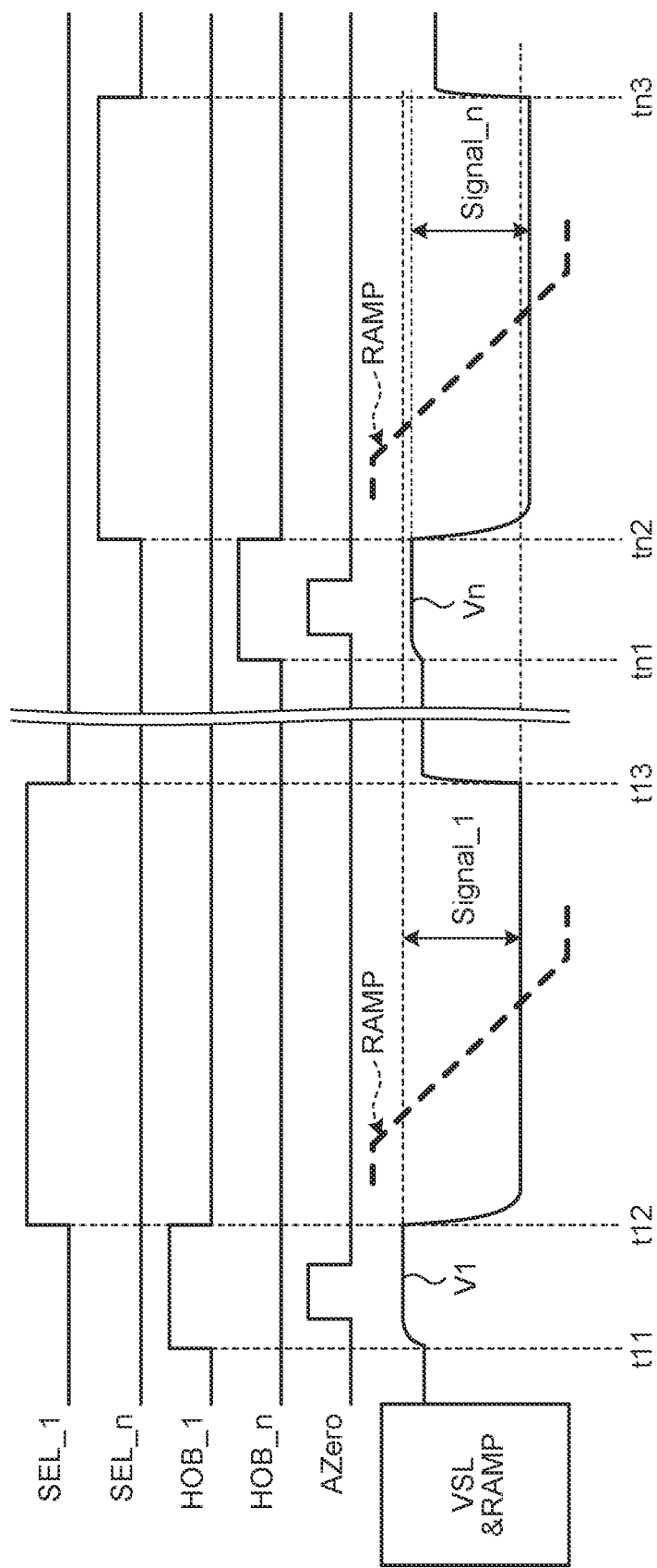
FIG. 7 is a timing chart depicting an example of a pixel signal readout operation.

FIG. 7 is a timing chart depicting an example of a pixel signal readout operation. "SEL_1" is a pixel selection signal for selecting the valid pixels 11a in the first row. "SEL_n" is a pixel selection signal for selecting the valid pixels 11a in the n-th row. "HOB_1" is a pixel selection signal for selecting the light-shielded pixels 12a in the first row. "HOB_n" is a pixel selection signal for selecting the light-shielded pixels 12a in the n-th row. "AZero" indicates an auto-zero operation. "VSL & RAMP" indicates the pixel signal of the valid pixel 11a and the reference signal RAMP.

At time t11, the pixel selection signal HOB_1 is turned on. The light-shielded pixels 12a in the first row are selected. The pixel signal of the light-shielded pixels 12a in the first row appears in the corresponding vertical signal line VL. The plurality of switches 4a are turned on, and the same pixel signal also appears in other vertical signal lines VL. An auto-zero operation using these pixel signals as a zero reset signal is started. That is, the switch 182 and the switch 183 of the comparison circuit 6a are turned on. The zero reset signal and the reference signal RAMP are input to the first input terminal and the second input terminal of the comparator 185. The zero reset signal and the reference voltage RAMP transition to a predetermined voltage V1 illustrated in the drawing, and the threshold variation of the comparator 185 is canceled.

At time t12, the pixel selection signal HOB_1 is turned off. The plurality of switches 4a are also turned off. The pixel signal of the light-shielded pixel 12a does not appear in the vertical signal line VL. The auto-zero operation is completed, and the switch 182 and the switch 183 of the comparison circuit 6a are turned off.

At time t12, the pixel selection signal SEL_1 is turned on. The valid pixels 11a in the first row are selected. The pixel signals of the valid pixels 11a of the first row appear in the corresponding vertical signal line VL and are supplied to the corresponding comparison circuit 6a. This pixel signals are referred to as Signal_1 in the drawing. The pixel signals and the reference signal RAMP are input to the first input terminal and the second input terminal of the comparator 185. The corresponding counter 7a counts the comparison result signal COM_Out of the comparator 185. An AD conversion result of the pixel signals of the valid pixels 11a in the first row is obtained.

At time t13, the pixel selection signal SEL_1 is turned off, and the readout of the pixel signals of the valid pixels 11a in the first row is terminated.

Time tn1 to time tn3 are operations related to the pixels of the n-th row. The description overlapping with the pixels in the first row will be appropriately omitted.

At the time tn1, the pixel selection signal HOB_n is turned on. The light-shielded pixels 12a in the n-th row are selected, and an auto-zero operation is performed using the pixel signals as a zero reset signal. The zero reset signal and the RAMP signal transition to a predetermined voltage Vn illustrated in the drawing, and the threshold variation of the comparator 185 is canceled.

At time tn2, the pixel selection signal HOB_n is turned off. The auto-zero operation is completed, and the switch 182 and the switch 183 of the comparison circuit 6a are turned off. At the time tn2, the pixel selection signal SEL_n is turned on. The pixel signals of the valid pixels 11a in the n-th row appear in the corresponding vertical signal line VL and are supplied to the corresponding comparison circuit 6a. This pixel signals are referred to as Signal_n in the drawing. The pixel signals and the reference signal RAMP are input to the first input terminal and the second input terminal of the comparator 185. The corresponding counter 7a counts the comparison result signal COM_Out of the comparator 185. An AD conversion result of the pixel signals of the valid pixels 11a in the n-th row is obtained.

At time tn3, the pixel selection signal SEL_n is turned off, and the readout of the pixel signal of the valid pixels 11a in the n-th row is terminated.

According to the above readout operation, when AD conversion is performed on the image signal of the valid pixels 11a in each row, the pixel signals of the light-shielded pixels 12a in the same row are used as the zero reset signal. Using the zero reset signal different for each row can inhibit variations in AD conversion results between the rows. As a result, it is possible to inhibit display variation in the vertical direction that may occur in the depth image. One of the causes of the display variation in the vertical direction is that the magnitude of the voltage drop generated until the pixel signal reaches the AD conversion circuit is different for each row. By using the zero reset signal different for each row as described above, the difference in voltage drop for each row is canceled. This can inhibit variations in AD conversion results between rows, and thus can inhibit display variation in the vertical direction of the depth image.

Figure 8:
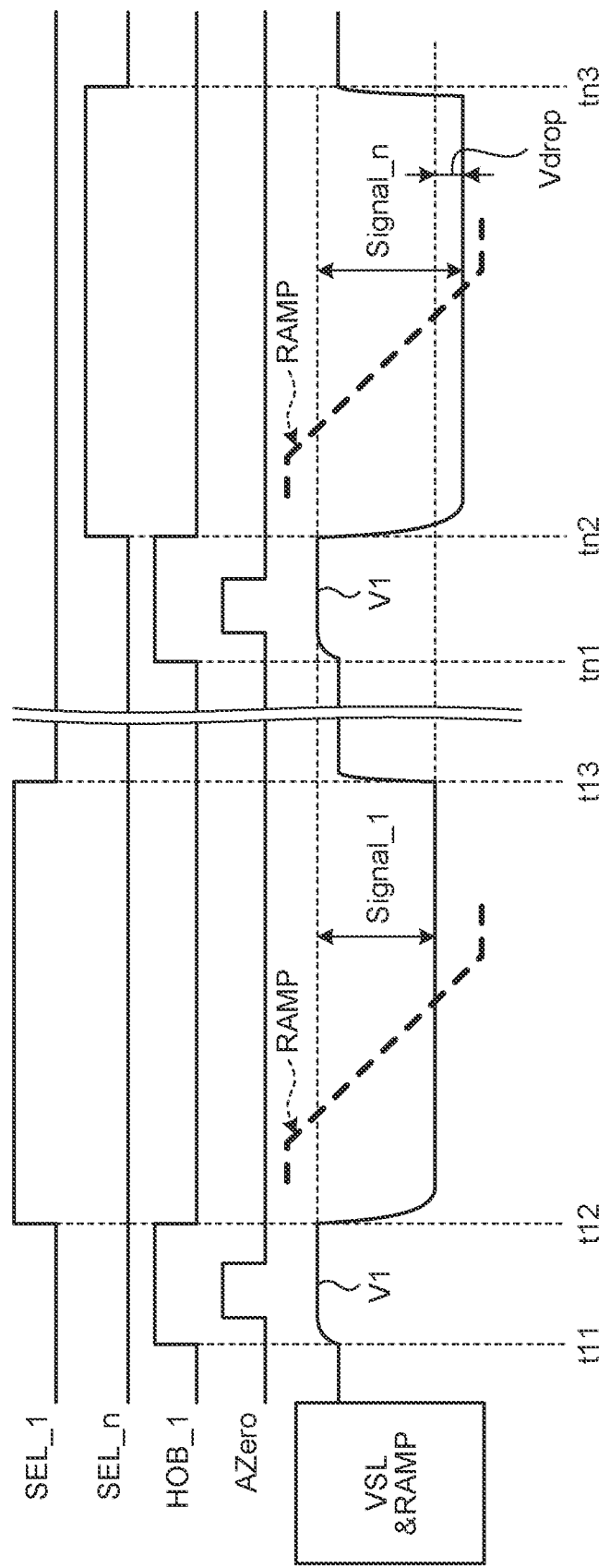
FIG. 8 is a timing chart depicting an example of a pixel signal readout operation according to a study example.

If the voltage after the transition by the auto-zero operation is constant regardless of row, for example, if the voltage Vn depicted in FIG. 7 is the same as the voltage V1, a problem as depicted in FIG. 8 described below occurs.

FIG. 8 is a timing chart depicting an example of a pixel signal readout operation according to a study example. In FIG. 8, in comparison with FIG. 7, the pixel selection signal HOB_1 is turned on at the time tn1 to the time tn2, and the pixel signals of the light-shielded pixels 12a in the first row are used as the zero reset signal also when the image signal of the valid pixels 11a in the n-th row is acquired. From the time tn2 to the time tn3, the pixel signals VSL_n of the valid pixels 11a in the n-th row are input to the comparator 185 with the voltage level lowered by a voltage drop Vdrop from the pixel signals VSL_1 of the valid pixels 11a in the first row. The deviation of the voltage level corresponding to the voltage drop Vdrop results in display variation in the vertical direction. According to the present embodiment, this variation is inhibited as described above with reference to FIG. 7.

Figure 9:
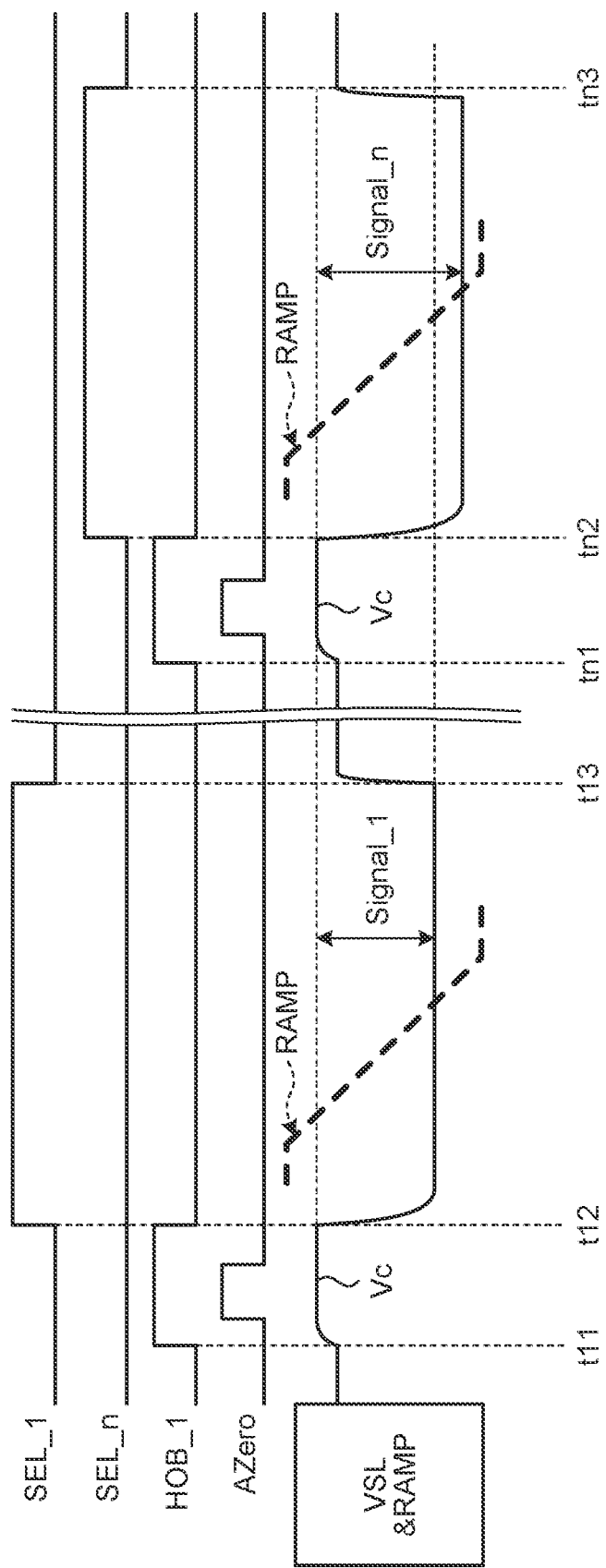
FIG. 9 is a timing chart depicting an example of a pixel signal readout operation.

On the other hand, as described above, the reference signal of the reference signal generation circuit 141 may be used as the zero reset signal. In such a case, the pixel signals of the plurality of valid pixels 11a and the plurality of light-shielded pixels 12a are collectively AD-converted for each row. That is, as depicted in FIG. 9, the pixel signals VSL_n of the valid pixels 11a in the n-th row is input to the comparator 185 with the voltage level lowered by the voltage drop Vdrop from the pixel signals VSL_1 of the valid pixels 11a in the first row. This is the same as FIG. 8 described above. In FIG. 9, the voltages after the transition by the auto-zero operation are all indicated as a predetermined voltage Vc.

Here, the signal processing section 92 generates a depth image signal based on the calculation result of the pixel signals of the plurality of valid pixels 11a after the AD conversion and the pixel signals of the plurality of light-shielded pixels 12a after the AD conversion. Examples on the calculation include a difference, and the signal processing section 92 subtracts the AD conversion result of the pixel signals of the light-shielded pixels 12a in the same row from the AD conversion result of the pixel signals of the valid pixels 11a for each row. Using the AD conversion result of the pixel signals of the light-shielded pixels 12a different for each row also can inhibit variations in the AD conversion results between the rows.

Display variation in the vertical direction includes streaking and power supply rejection ration (PSRR) in addition to the above-described vertical shading. The display variation in the vertical direction due to vertical shading, streaking, and PSRR will be described with reference to FIGS. 10 to 12.

Figure 10:
FIG. 10 is a diagram depicting an example of display variation in a vertical direction due to vertical shading.

FIG. 10 is a diagram depicting an example of display variation in the vertical direction due to vertical shading. The displayed color becomes closer to black toward the upper portion. This is because the pixel signal of a pixel located at the upper position is more affected by the voltage drop, and the signal level input to the comparator 185 decreases. Such display variation in the vertical direction due to vertical shading is inhibited.

Figure 11:
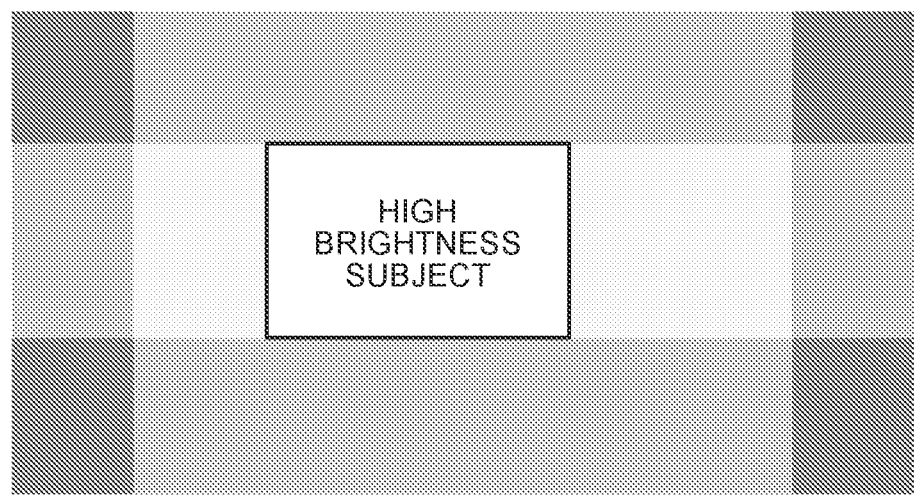
FIG. 11 is a diagram depicting an example of display variation in the vertical direction due to streaking.

FIG. 11 is a diagram depicting an example of display variation in the vertical direction due to streaking. Streaking is a phenomenon in which, in a case where a white subject (bright subject) is present, a surrounding portion is also displayed in a color close to white. This is because the current at the time of AD conversion of the pixel signal of the valid pixel 11a in which the white subject is captured increases. Since the AD conversion is performed for each row, a color change occurs for each row, and display variation in the vertical direction occurs. Such display variation in the vertical direction due to streaking is also inhibited.

FIG. 12 is a diagram depicting an example of display variation in the vertical direction due to PSRR. This variation is caused by variation of the AD conversion result due to power supply noise. Since the AD conversion is performed for each row, a color change occurs for each row, and display variation in the vertical direction occurs. Such display variation in the vertical direction due to PSRR is also inhibited. This effect can be obtained regardless of whether the generation cycle of the power supply noise is a fixed cycle or a random cycle.

For example, the display variation in the vertical direction due to vertical shading, streaking, or PSRR as described above is inhibited by the distance measuring device 500 according to the embodiment. In addition, it is also possible to inhibit display variation in the vertical direction and the like caused by a difference in the dark current component for each row.

2. Modifications

2.1 Example of Schematic Configuration of Pixel

The configuration of pixels is not limited to the example described above with reference to FIG. 5. Some modifications will be described with reference to FIGS. 13 to 20. For the portions that are not specifically described, any configuration within the scope of the description so far may be adopted without contradiction.

Figure 13:
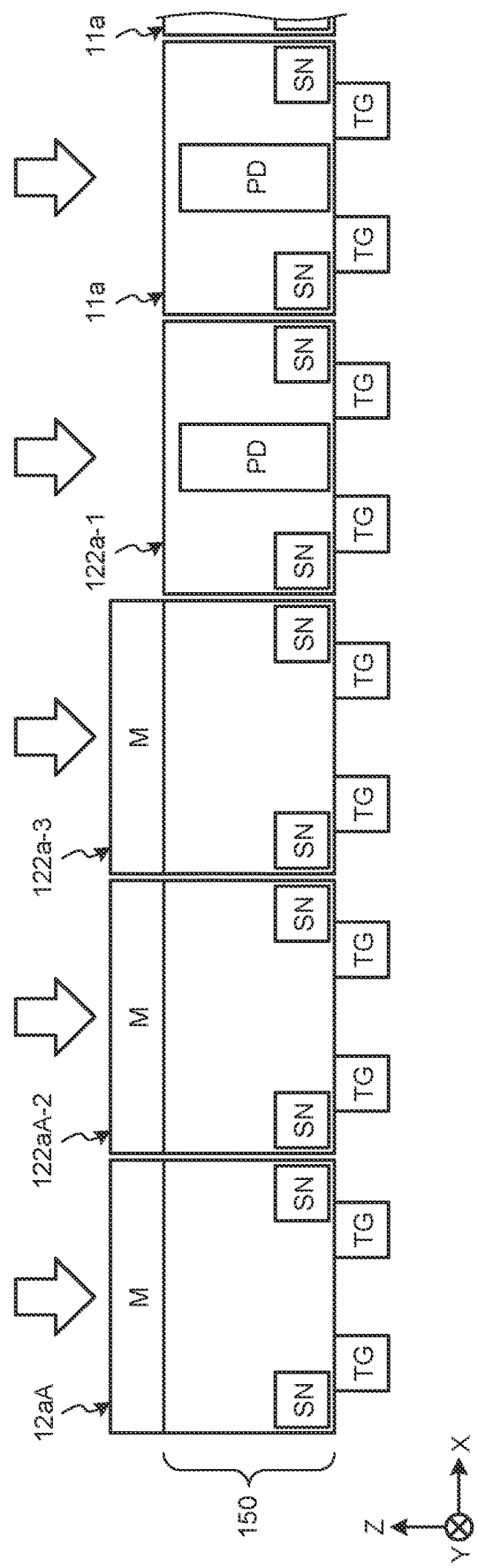
FIG. 13 is a diagram depicting an example of a schematic configuration of pixels.

In FIG. 13, the valid pixel 11*a*, a light-shielded pixel 12*a*A, an invalid pixel 122*a*-1, an invalid pixel 122*a*A-2, and an invalid pixel 122*a*-3 are illustrated. The light-shielded pixel 12*a*A does not include the photoelectric conversion section PD. Such a light-shielded pixel 12*a*A may also be used as a light-shielded pixel in the same manner as the light-shielded pixel 12*a* (FIG. 5). The invalid pixel 122*a*A-2 does not include the photoelectric conversion section PD either. Since there are pixels having no photoelectric conversion section PD, the influence of obliquely incident light (see FIG. 16 described later) can be reduced. It is also possible to reduce the number of required light-shielded pixels.

Figure 14:
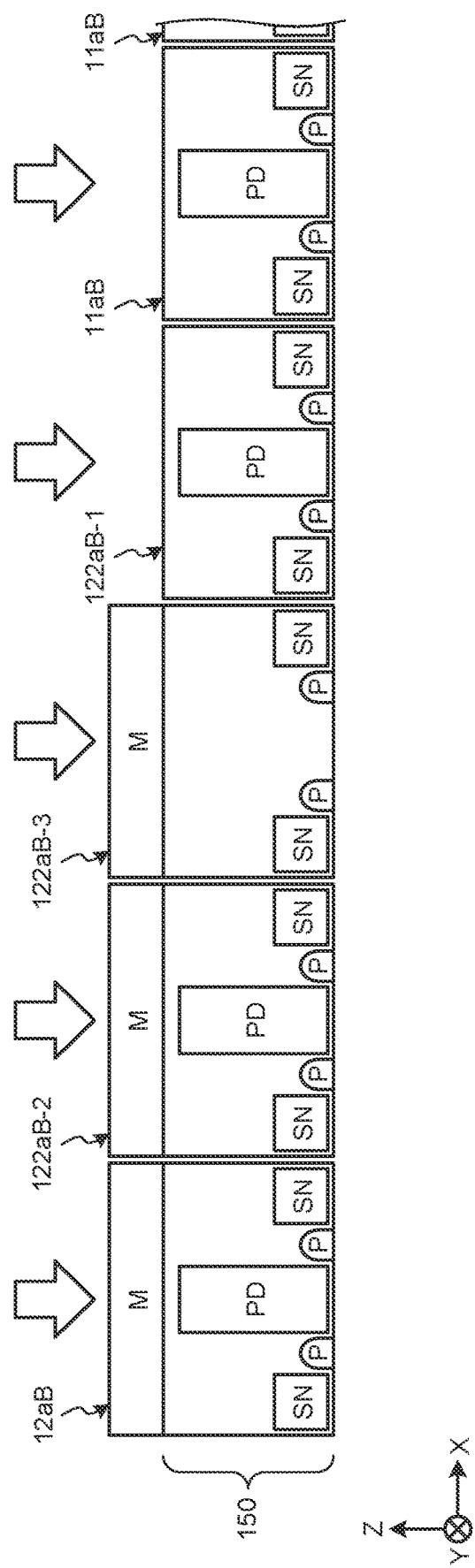
FIG. 14 is a diagram depicting an example or a schematic configuration of pixels.

In FIG. 14, a valid pixel 11*a*B, a light-shielded pixel 12*a*B, an invalid pixel 122*a*B-1, an invalid pixel 122*a*B-2, and an invalid pixel 122*a*B-3 are illustrated. These pixels are current-assisted photonic demodulator (CAPD) type pixels and have a p-type region instead of the transfer gate TG. The voltage GDA or the voltage GDB is directly applied to the p-type region without an electrode. The driving speed can be increased as compared with the case where the voltage GDA and the voltage GDB are applied via the transfer gate. Examples of the equivalent circuit of the CAPD type pixel include an equivalent circuit in a case where there is no transfer transistor 14 in FIG. 4.

Figure 15:
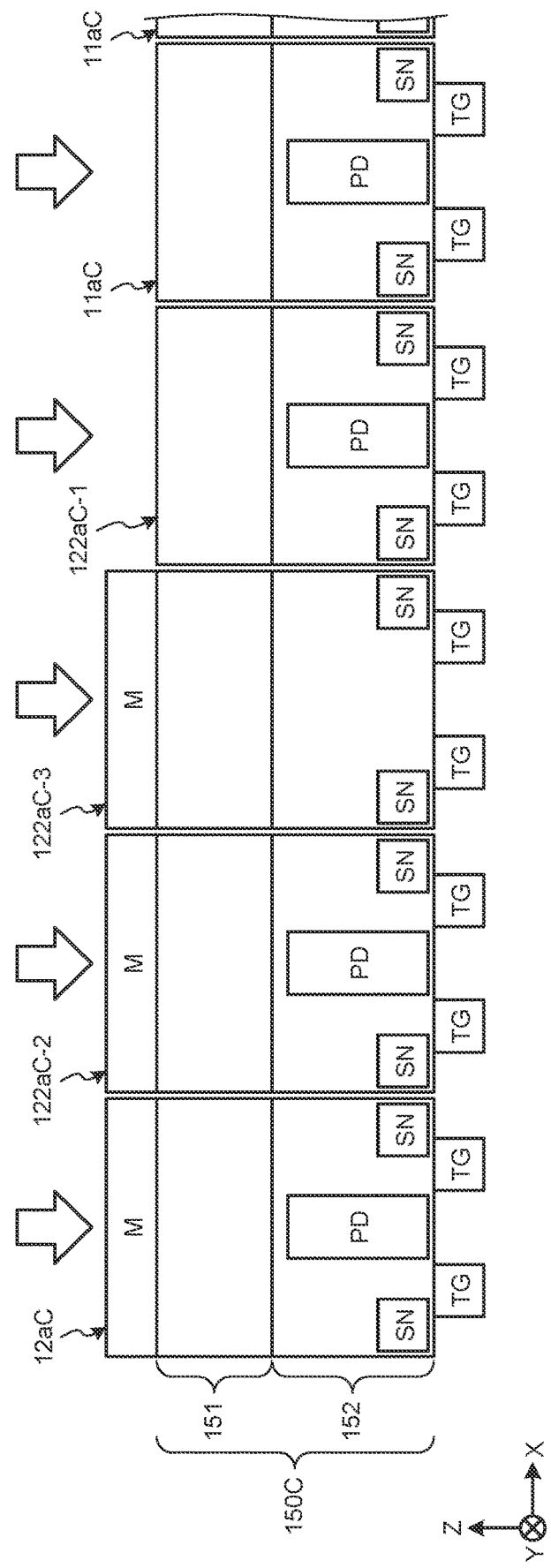
FIG. 15 is a diagram depicting an example of a schematic configuration of pixels.

In FIG. 15, a valid pixel 11*a*C, a light-shielded pixel 12*a*C, an invalid pixel 122*a*C-1, an invalid pixel 122*a*C-2, and an invalid pixel 122*a*C-3 provided on a semiconductor substrate 150C are illustrated. The semiconductor substrate 150C is made of a plurality of semiconductor materials and includes a first semiconductor layer 151 and a second semiconductor layer 152 in this example. The material of the first semiconductor layer 151 and the material of the second semiconductor layer 152 are different from each other. Examples of the materials include Si, Ge, SiGe, and InGaAs. For example, the material of the first semiconductor layer 151 is Si, and the material of the second semiconductor layer 152 is Ga or InGaAs. The photoelectric conversion section PD is provided in the second semiconductor layer 152.

Figure 16:
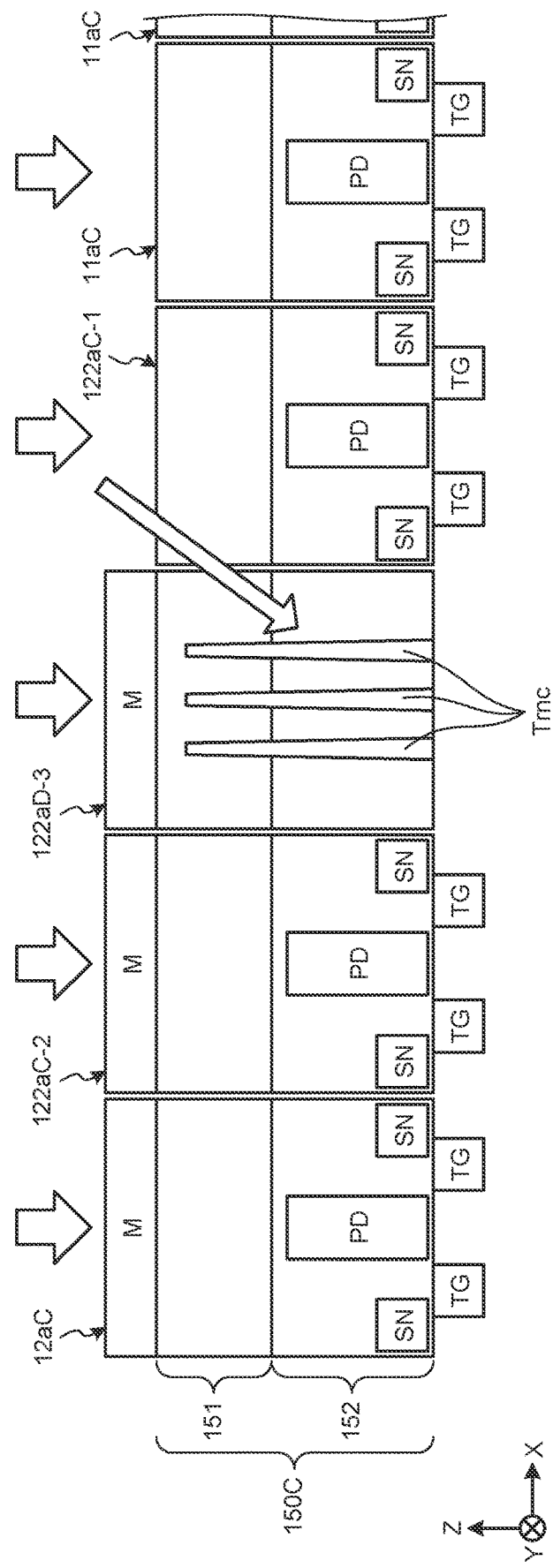
FIG. 16 is a diagram depicting an example of a schematic configuration of pixels.

In FIG. 16, a valid pixel 11*a*C, a light-shielded pixel 12*a*C, an invalid pixel 122*a*C-1, an invalid pixel 122*a*C-2, and an invalid pixel 122*a*D-3 are illustrated. The invalid pixel 122*a*D-3 does not include the transfer gate TG or the storage node SN. The invalid pixel 122*a*D-3 is provided with a plurality of trench sections Trnc. The trench sections Trnc provide electrical and optical isolation and particularly serve here to block light. In the invalid pixel 122*a*D-3, the trench sections Trnc extend toward the light incident surface side with the surface of the semiconductor substrate 150C on the transfer gate TG side as a base end. The trench sections Trnc may have a plate shape having surfaces facing respective pixels on both sides (in this example, the invalid pixel 122*a*C-1 and the invalid pixel 122*a*C-2). The trench sections Trnc can inhibit incidence of obliquely incident light illustrated by a white arrow in an oblique direction on the light-shielded pixel 12*a*C. Examples of the material of the trench sections Trnc include tungsten.

Figure 17:
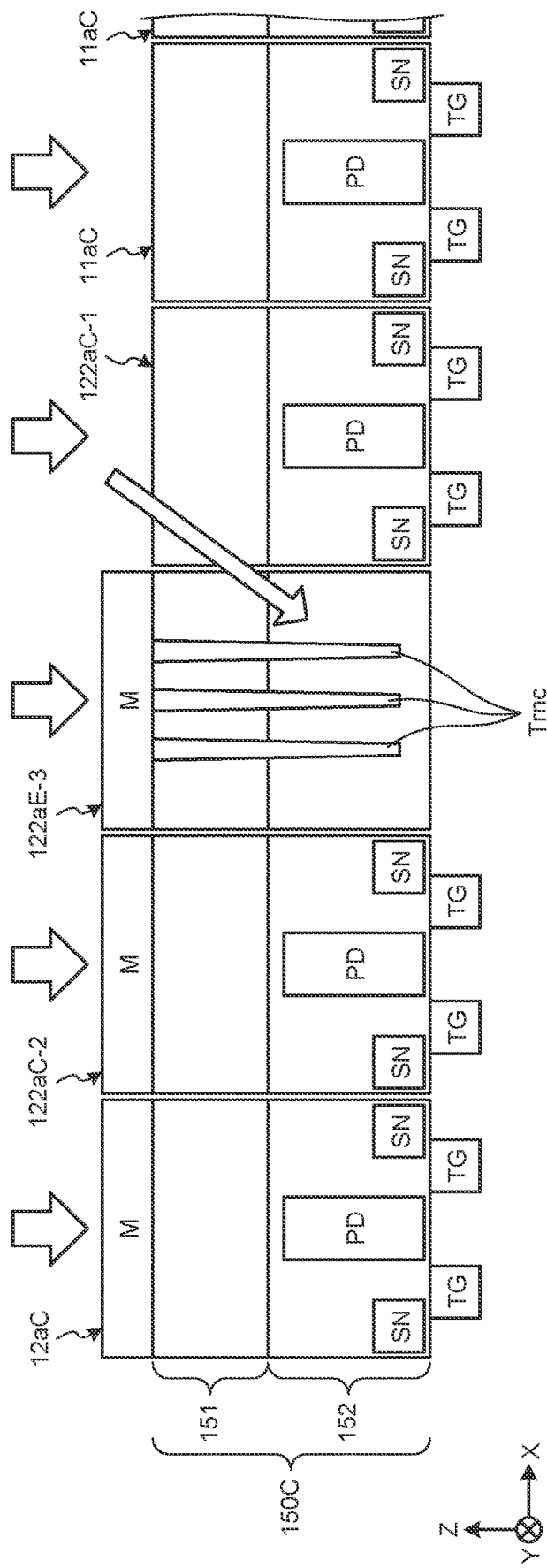
FIG. 17 is a diagram depicting an example of a schematic configuration of pixels.

In FIG. 17, a valid pixel 11*a*C, a light-shielded pixel 12*a*C, an invalid pixel 122*a*C-1, an invalid pixel 122*a*C-2, and an invalid pixel 122*a*E-3 are illustrated. In the invalid pixel 122*a*E-3, the plurality of trench sections Trnc extend toward the surface on the transfer gate TG side with the light incident surface of the semiconductor substrate 150C as a base end. The role of the trench sections Trnc is as described above.

Figure 18:
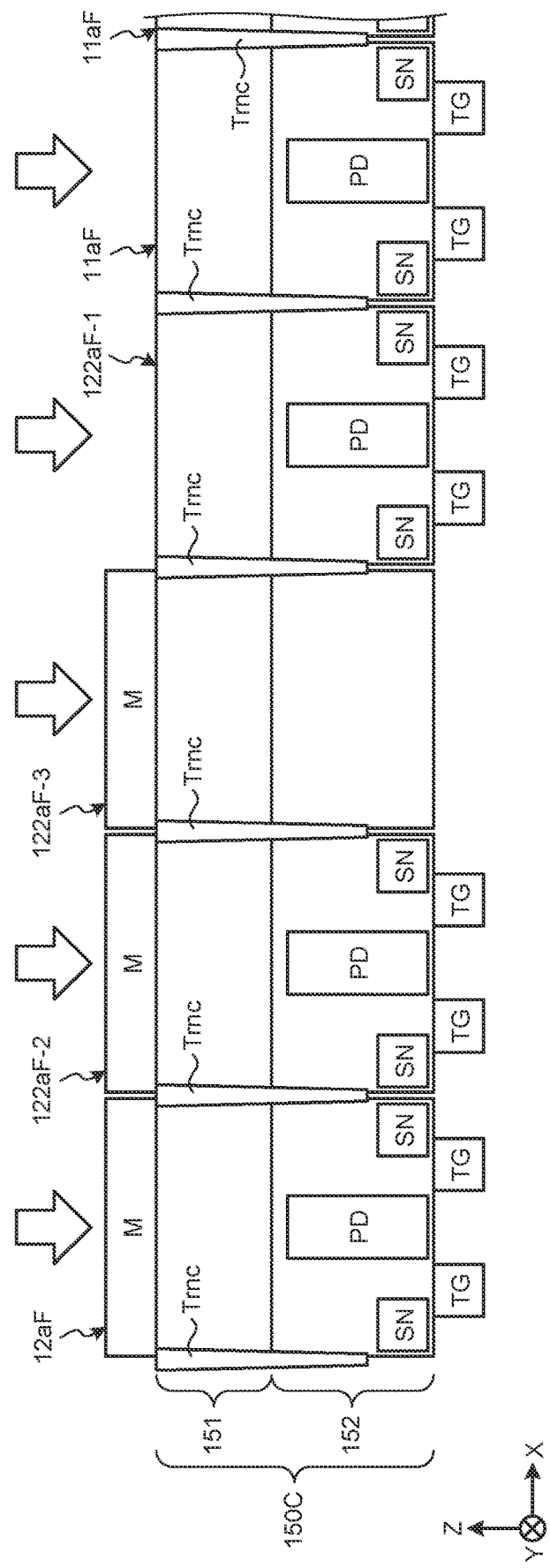
FIG. 18 is a diagram depicting an example or a schematic configuration of pixels.

In FIG. 18, a valid pixel 11*a*F, a light-shielded pixel 12*a*F, an invalid pixel 122*a*F-1, an invalid pixel 122*a*F-2, and an invalid pixel 122*a*F-3 are illustrated. A trench section Trnc is provided between adjacent pixels. Providing the trench section Trnc for each pixel in this manner can attenuate obliquely incident light.

Figure 19:
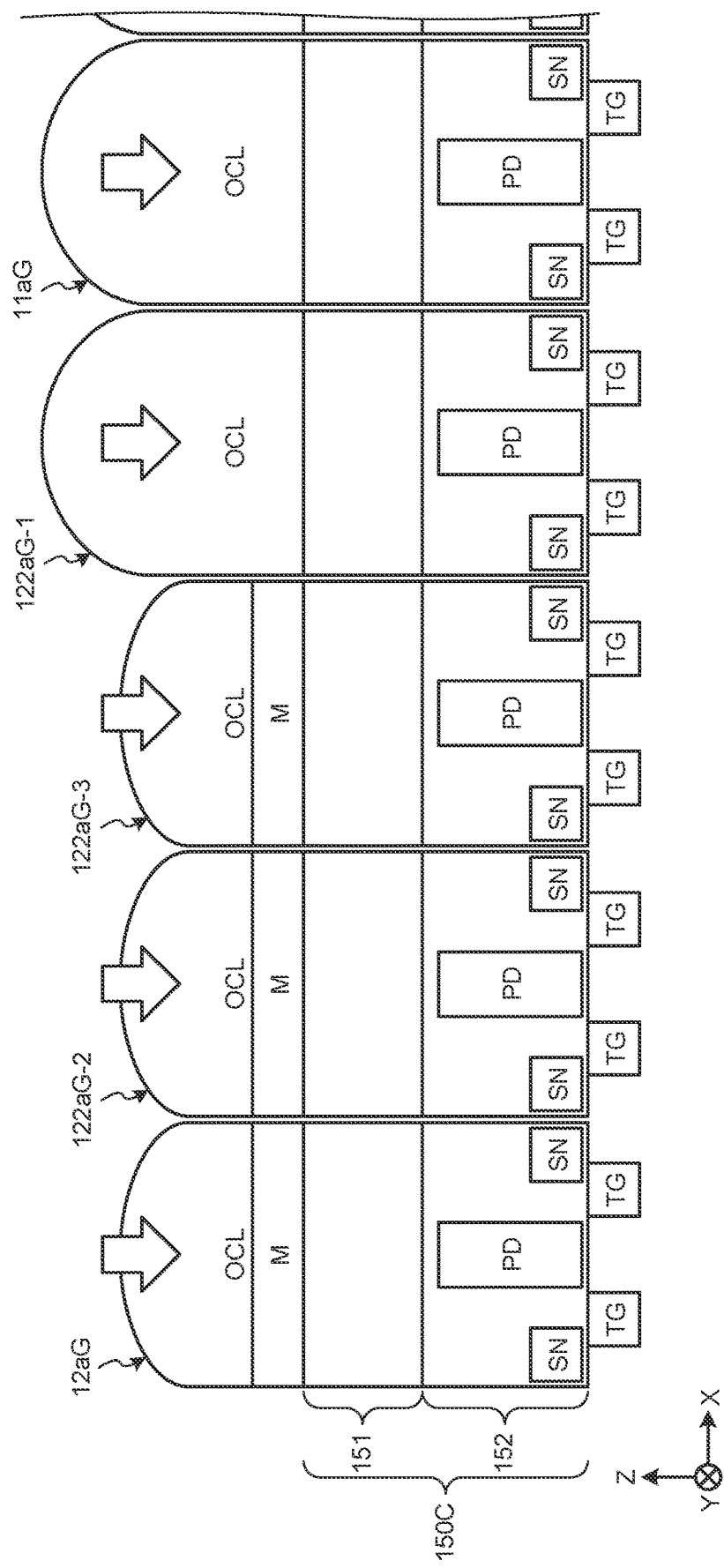
FIG. 19 is a diagram depicting an example of a schematic configuration of pixels.

In FIG. 19, a valid pixel 11*a*G, a light-shielded pixel 12*a*G, an invalid pixel 122*a*G-1, an invalid pixel 122*a*G-2, and an invalid pixel 122*a*G-3 are illustrated. Each pixel includes an on-chip lens OCL. The on-chip lenses OCL of at least some pixels other than the valid pixel 11*a* have a shape different from the shape of the on-chip lens OCL of the valid pixel 11*a*G. Examples of the difference in the shape include a difference in height, curvature, or the like of the on-chip lens OCL. In this example, the on-chip lenses OCL of the light-shielded pixel 12*a*G, the invalid pixel 122*a*G-2, and the invalid pixel 122*a*G-3 have a shape different from the shape of the on-chip lens OCL of the valid pixel 11*a*. In the pixels other than the valid pixel 11*a*G, the necessity of the on-chip lens OCL low, and there is no need to form the on-chip lens OCL as precisely as to form the on-chip lens OCL of, for example, the valid pixel 11*a*G. The difference in the shape of the on-chip lens OCL as depicted can be allowed, and for example, the yield can be improved accordingly.

Figure 20:
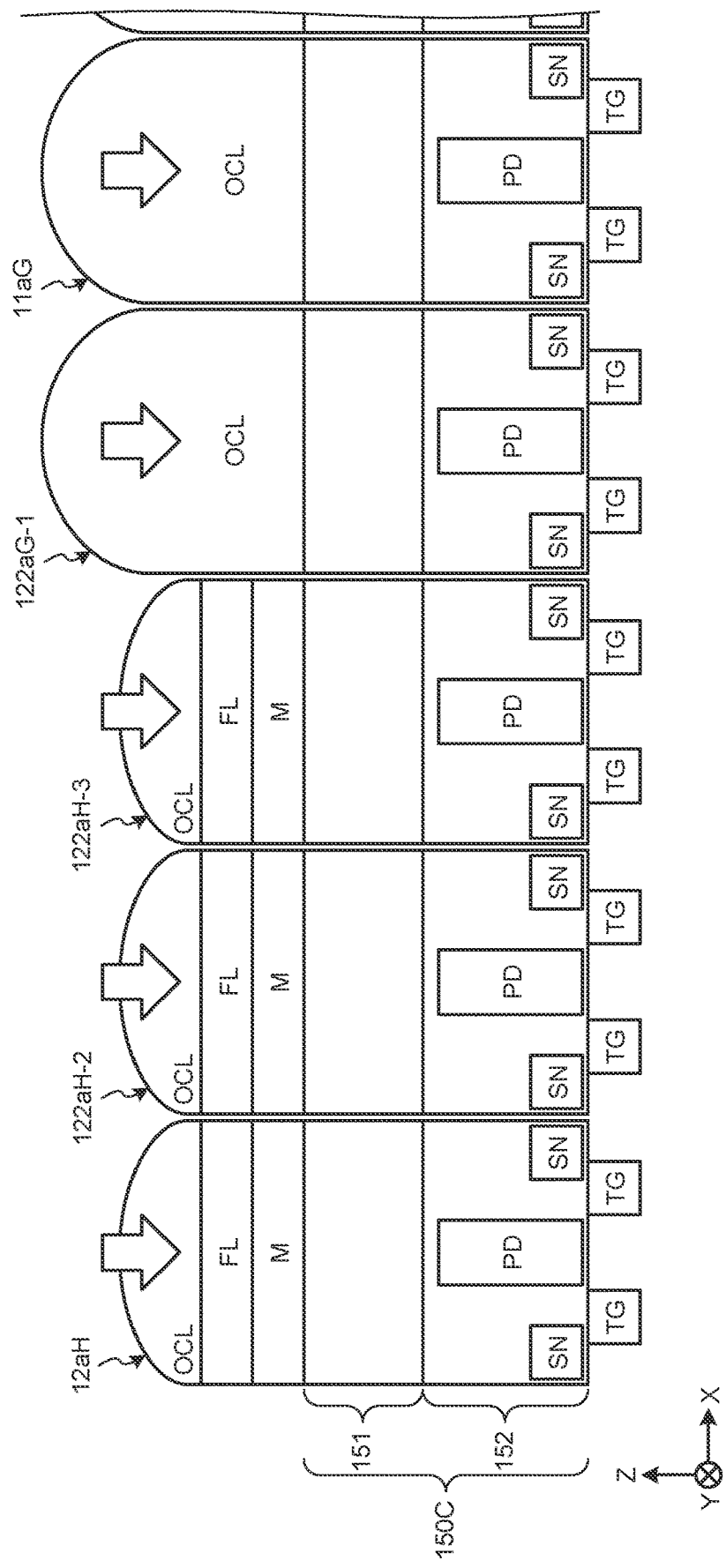
FIG. 20 is a diagram depicting an example of a schematic configuration of pixels.

In FIG. 20, the valid pixel 11*a*G, a light-shielded pixel 12*a*H, an invalid pixel 122*a*G-1, an invalid pixel 122*a*H-2, and an invalid pixel 122*a*H-3 are illustrated. The light-shielded pixel 12*a*H, the invalid pixel 122*a*H-2, and the invalid pixel 122*a*H-3 include an antireflection film FL covering the light-shielding film M. This configuration can reduce an influence caused by reflection of incident light on the light-shielded pixel 12*a*H, the invalid pixel 122*a*G-1, the invalid pixel 122*a*H-2, and the invalid pixel 122*a*H-3 (for example, leakage of light to other pixels).

Although an example in which the invalid pixel provided in the buffer region (the region between the valid pixels and the light-shielded pixels) has been described above, the invalid pixel does not have to be provided. In such a case, the light-shielded pixel may be provided adjacent to the valid pixel or may be provided at a certain distance from the valid pixel.

2.2 Example of Layout of Light Receiving Section

Some examples of the layout of the light receiving section 502 will be described with reference to FIGS. 21 to 27. FIGS. 21 to 27 are diagrams each depicting a layout example of the light receiving section. Regarding the correspondence relationship between the terms in the drawings and the elements described so far, the terms "valid pixel region" and "light-shielded pixel region" include the region 11 where the valid pixel 11a is provided and the region 12 where the light-shielded pixel 12a and the like are provided, the regions being described with reference to FIGS. 2, 4, and other drawings. Hereinafter, the "valid pixel region" and "light-shielded pixel region" are collectively referred to as "pixel region". The term "pixel modulation control circuit" includes the tap driving circuit 2 described with reference to FIG. 2 and other drawings. The term "pixel drive control circuit" includes the vertical scanning circuit 3 and the horizontal scanning circuit 9 described with reference to FIG. 2 and other drawings. The term "AD conversion circuit" includes the comparison circuit section 6 and the counter section 7 described with reference to FIGS. 2, 6, and other drawings. The term "dummy source follower" includes the reference signal generation section 4 and the constant current circuit section 5 described with reference to FIGS. 2, 6, and other drawings.

The above-described correspondence relationship is an example, and it may be appropriately changed within a range that can be laid out. Elements not depicted may be appropriately laid out.

In the example depicted in FIG. 21, in the pixel region, light-shielded pixel regions are provided on both sides of the valid pixel region. That is, the plurality of light-shielded pixels are provided in the column direction on the two end sides in the row direction with respect to the region where the plurality of valid pixels are provided. As the pixel signal of the light-shielded pixel, an average signal of the pixel signals of the light-shielded pixels on both sides may be used. When the pixel signal of the light-shielded pixel is used as the zero reset signal, an average signal is obtained by causing the pixel signals on both sides to appear in the same vertical signal line VL (comparator input section). When the pixel signal of the light-shielded pixel is used for calculation (difference) after AD conversion, an average signal is obtained by averaging AD conversion results of the pixel signals on both sides. This configuration improves, for example, surface uniformity. This configuration also inhibits non-uniformity derived from the power supply difference of the pixels. Since the layout symmetry improves, structural uniformity also improves. The reliability also improves with an increased number of samples of the pixel signal of the light-shielded pixels.

In the example depicted in FIG. 22, the light-shielded pixel region is provided also in the row direction on the opposite side of the valid pixel region from the AD conversion circuit. Each of the plurality of light-shielded pixels (more specifically, the tap TA and the tap TB) provided in the row direction is connected to the corresponding vertical signal line VL. Using the pixel signals of these light-shielded pixels as offset signals indicating, for example, a black level, can remove an offset component for each column. Removal of the offset component may be performed by calculation (subtraction or the like) after AD conversion.

Figure 23:
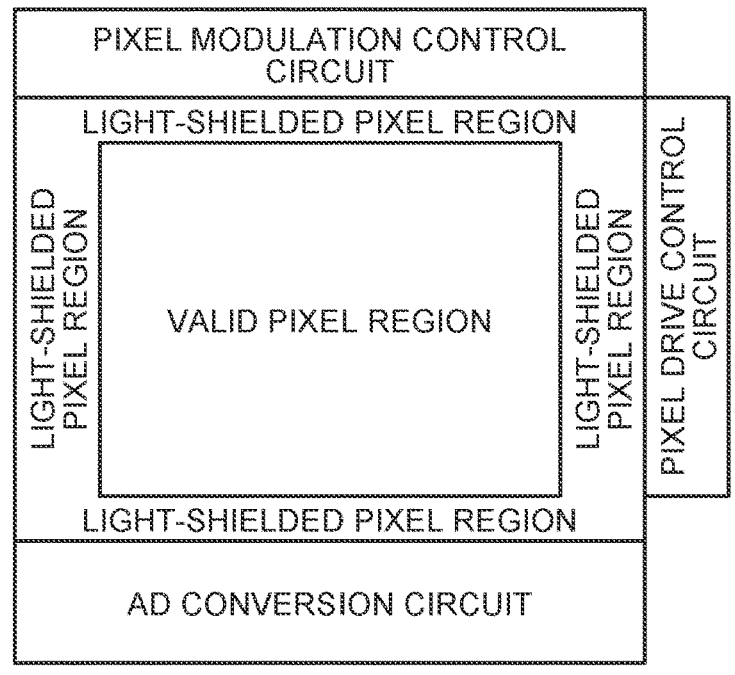
FIG. 23 is a diagram depicting a layout example of the light receiving section.

In the example depicted in FIG. 23, a light-shielded pixel region is provided also in the row direction between the valid pixel region and the AD conversion circuit. Using the average value of the light-shielded pixels of the two light-shielded pixel regions provided in the row direction further improves the surface uniformity. In such a configuration in which the light-shielded pixel regions are provided on all of the four sides, it is also possible to evaluate the light amount (color mixing component or the like) of the incident light on the adjacent pixels from the light amount incident on the light-shielded pixels of each light-shielded pixel region.

Figure 24:
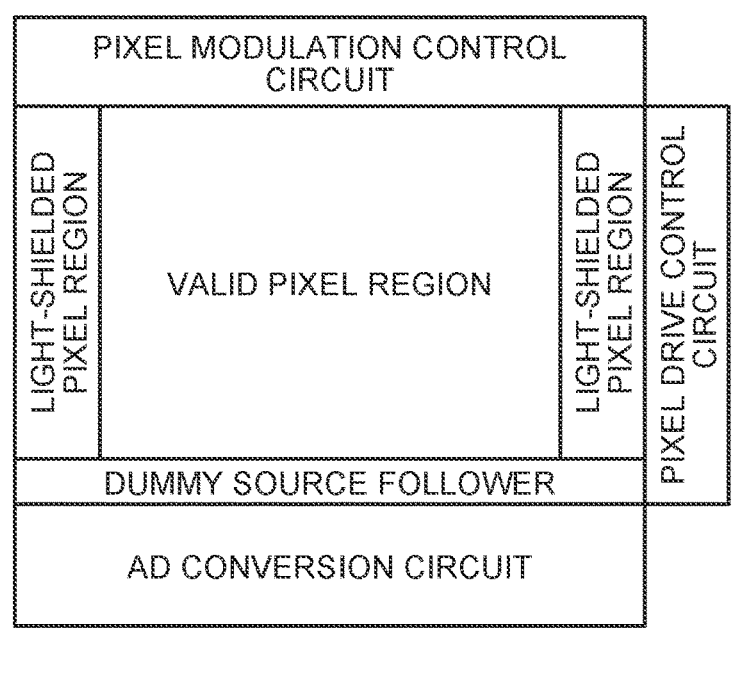
FIG. 24 is a diagram depicting a layout example of the light receiving section.

In FIG. 24, a dummy source follower (the reference signal generation section 4 and the constant current circuit section 5 in FIG. 2 and other drawings) is also illustrated. In this example, the dummy source follower is provided between the pixel region and the AD conversion circuit as described above with reference to FIG. 2 and other drawings. When the dummy source follower is used, since the number of dispositions can be increased by reducing the layout, the variation can be reduced accordingly. In addition, the dummy source follower may be used as a zero reset signal having no pixel dark current. The stabilization time may be shortened (high-speed AD conversion is achieved) by reducing the parasitic capacitance or disposing the dummy source follower near the AD conversion circuit. By obtaining the input voltage from the outside, for example, the reference signal generation section 8 (FIG. 2 and other drawings) and other external voltages, any voltage can be generated to obtain a zero reset signal. The dummy source follower may also be used for a test, in addition to high-speed AD conversion.

Figure 25:
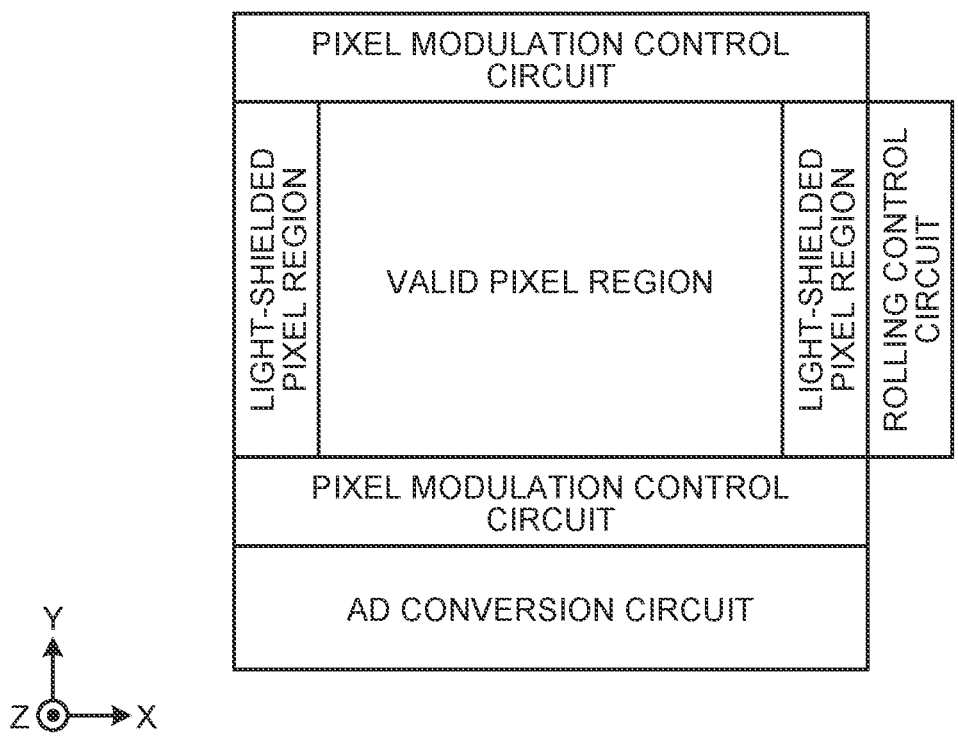
FIG. 25 is a diagram depicting a layout example of the light receiving section.

In the example depicted in FIG. 25, the pixel modulation control circuits are provided on the upper side and the lower side of the pixel region, respectively. In this example, the pixel region has a landscape-oriented aspect ratio, and the pixel modulation control circuit is provided to face the two long sides. This enables high-speed modulation as compared with a case where the pixel modulation control circuit is provided to face only one side or to face a short side.

Figure 26:
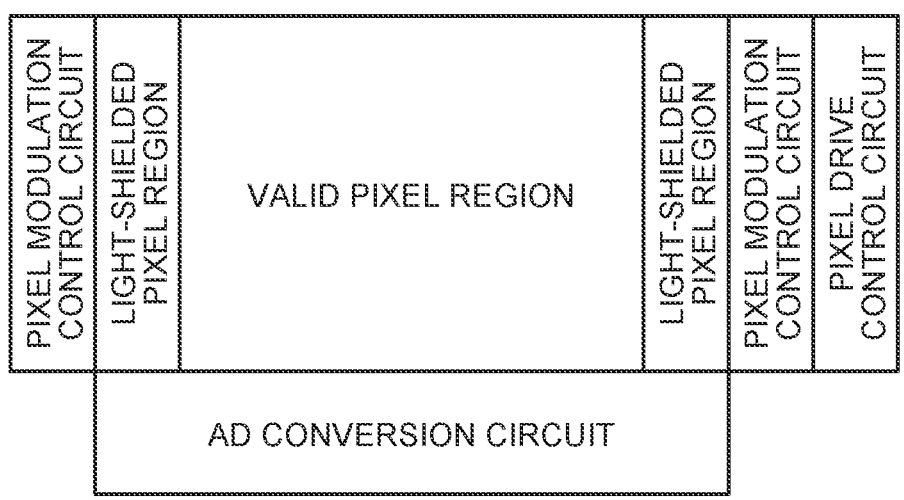
FIG. 26 is a diagram depicting a layout example of the light receiving section.

In the example depicted in FIG. 26, the pixel modulation control circuit is provided on each of the left side and the right side of the pixel region. In this example, the pixel region has a landscape-oriented aspect ratio, and the pixel modulation control circuits are provided to face the two short sides. With this configuration, it is possible to cope with an increase in the pixel load caused by the disposition in which the circuits face the short sides instead of the long sides.

Figure 27:
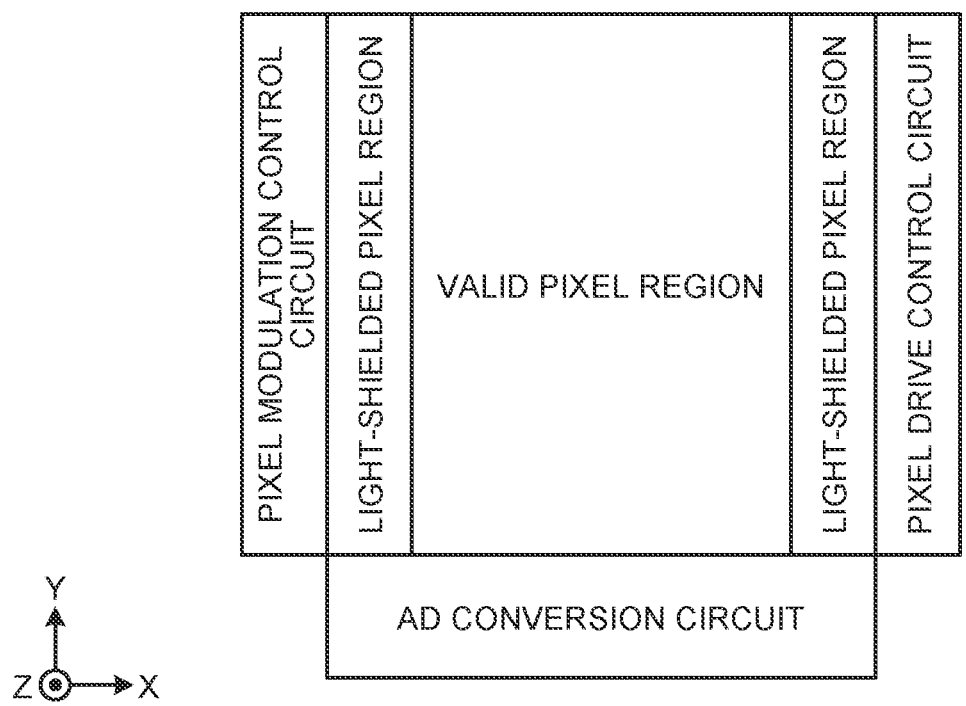
FIG. 27 is a diagram depicting a layout example of the light receiving section.

In the example depicted in FIG. 27, the pixel region has a length in the row direction (portrait-oriented aspect ratio) shorter than a length in the column direction. The pixel modulation control circuit and the pixel drive control circuit are provided to face the long sides of the pixel region. In this example, the pixel modulation control circuit is provided on the left side of the pixel region. The pixel drive control circuit is provided on the right side of the pixel region. The various layouts described above can be applied in the case of a portrait-oriented aspect ratio not only in the example depicted in FIG. 27.

2.3 Example of Stacked Structure

The light receiving section 502 may have a stacked structure to obtain a stack sensor. This configuration will be described with reference to FIG. 28.

Figure 28:
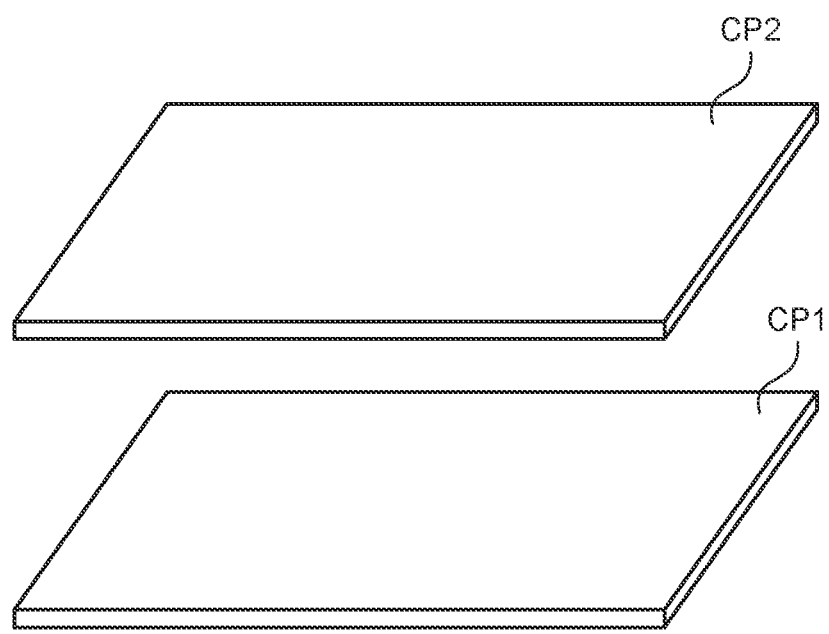
FIG. 28 is a diagram depicting an example of a stacked structure.

FIG. 28 is a diagram depicting an example of the stacked structure. In this example, a chip CP1 and a chip CP2 are attached to one above the other. The positional relationship between the chip CP1 and the chip CP2 may be reversed from the depicted example. The chip CP1 is a first semiconductor chip in which at least some (for example, a photoelectric conversion section or the like) elements of plurality of pixels (valid pixels, light-shielded pixels, invalid pixels, and the like) are provided. The chip CP2 is a second semiconductor chip provided with at least some of the elements other than the elements provided on the chip CP1. Some specific examples of element layouts are described below with reference to FIGS. 29 to 36.

Examples of joining of the chip CP1 and the chip CP2 include direct joining in which joint surfaces of the chips CP1 and CP2 are flattened and attached to each other by an interelectronic force. Examples of joining including electrical connection include Cu—Cu joining in which electrode pads made of copper (Cu) formed on the joining surfaces are bonded to each other, TSV joining using a through-silicon via (TSV) penetrating a semiconductor substrate, and bump joining.

In the above stacked structure, the light receiving efficiency can be improved, for example by collecting, in the chip CP1, the photoelectric conversion section and the like among the elements of the pixels and collecting the other elements in the chip CP2.

FIGS. 29 to 36 are diagrams each depicting a layout example of the chips. Regarding the correspondence relationship between the terms in the drawings and the elements described so far, the terms "valid pixel region" and "light-shielded pixel region" are as described above, and they are collectively referred to as "pixel region". The terms "pixel modulation control circuit", "pixel drive control circuit", and "AD conversion circuit" are also as described above. The term "interconnect region" corresponds to the region that provides the electrical connection between the chips. The term "logic circuit" includes the system control section 91, the signal processing section 92, and the data storage section 93 described with reference to FIG. 2 and other drawings. The term "pixel readout line" includes the vertical signal line VL described with reference to FIGS. 2, 4, 6, and other drawings. The term "modulation signal line" includes a line to which the voltage GDA and the voltage GDB are supplied, which have been described with reference to FIGS. 2, 4, and other drawings. The term "pixel readout circuit" includes the reference signal generation section 4 and the constant current circuit section 5 described with reference to FIGS. 2, 6, and other drawings.

The above-described correspondence relationship is an example, and it may be appropriately changed within a range that can be laid out. Elements not depicted may be appropriately laid out.

Figure 29:
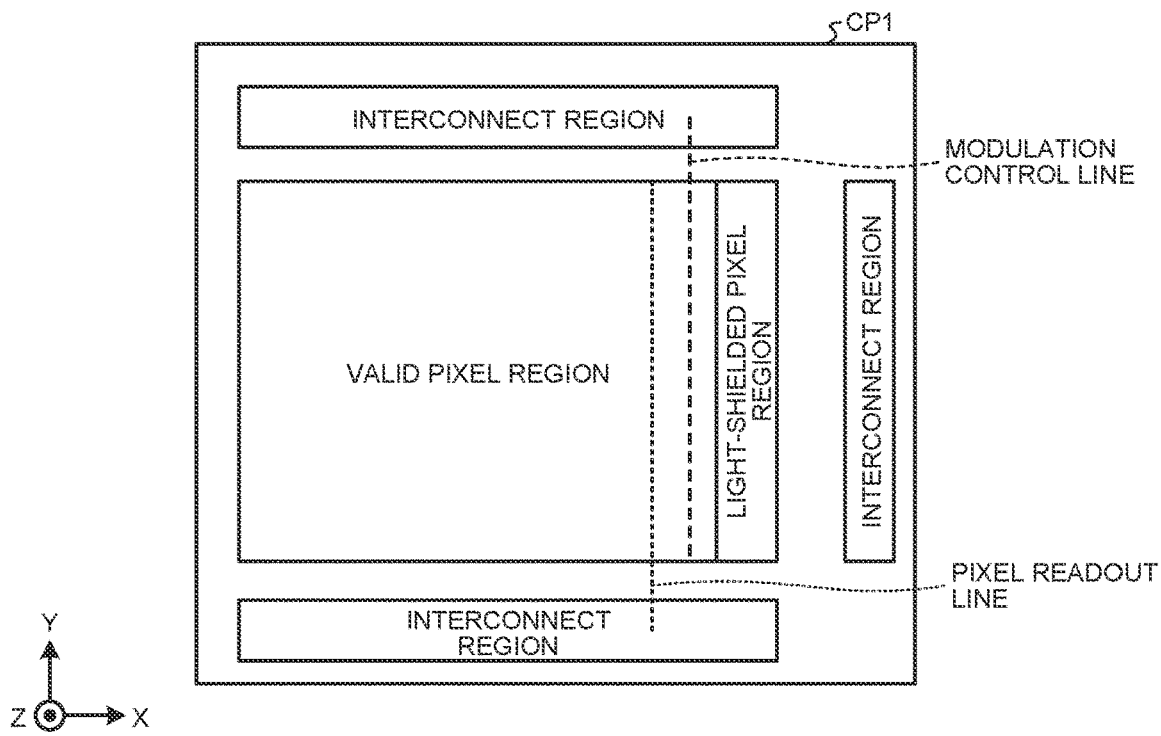
FIG. 29 is a diagram depicting a layout example of a chip.
Figure 30:
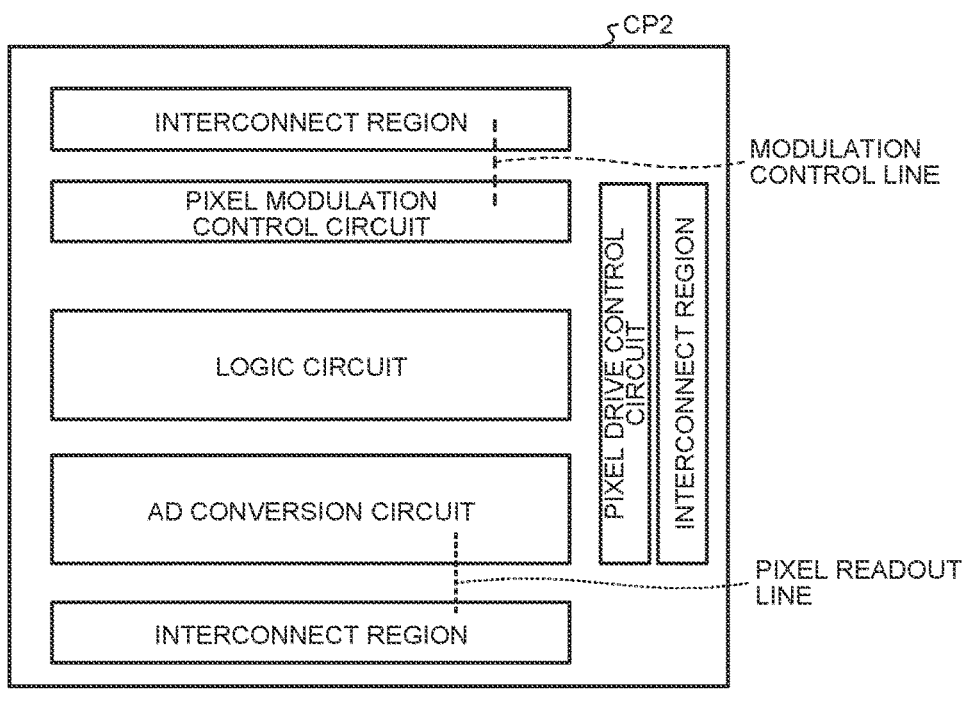
FIG. 30 is a diagram depicting a layout example of the chip.

In the example depicted in FIGS. 29 and 30, in the chip CP1, the pixel region is provided substantially at the center, and the interconnect region is provided on each of the upper side, the lower side, and the right side of the pixel region. In the chip CP2, an interconnect area is provided at a position corresponding to the interconnect area of the chip CP1. The pixel modulation control circuit is provided near the upper interconnect region. The AD conversion circuit is provided near the lower interconnect region. The logic circuit is provided near the AD conversion circuit. The pixel drive control circuit is provided near the interconnect region on the right.

A part of the modulation control line and the pixel readout line is schematically indicated by a broken line. The modulation signal line is connected from the pixel modulation control circuit of the chip CP2 to the pixel region of the chip CP1 via the upper interconnect region. The pixel readout line is connected to the AD conversion circuit of the chip CP2 from the pixel region of the chip CP1 via the lower interconnect region. The line (not illustrated) that supplies a control signal or the pixel drive control circuit of the chip CP2 is connected to the pixel region of the chip CP1 via the right interconnect region.

Figure 31:
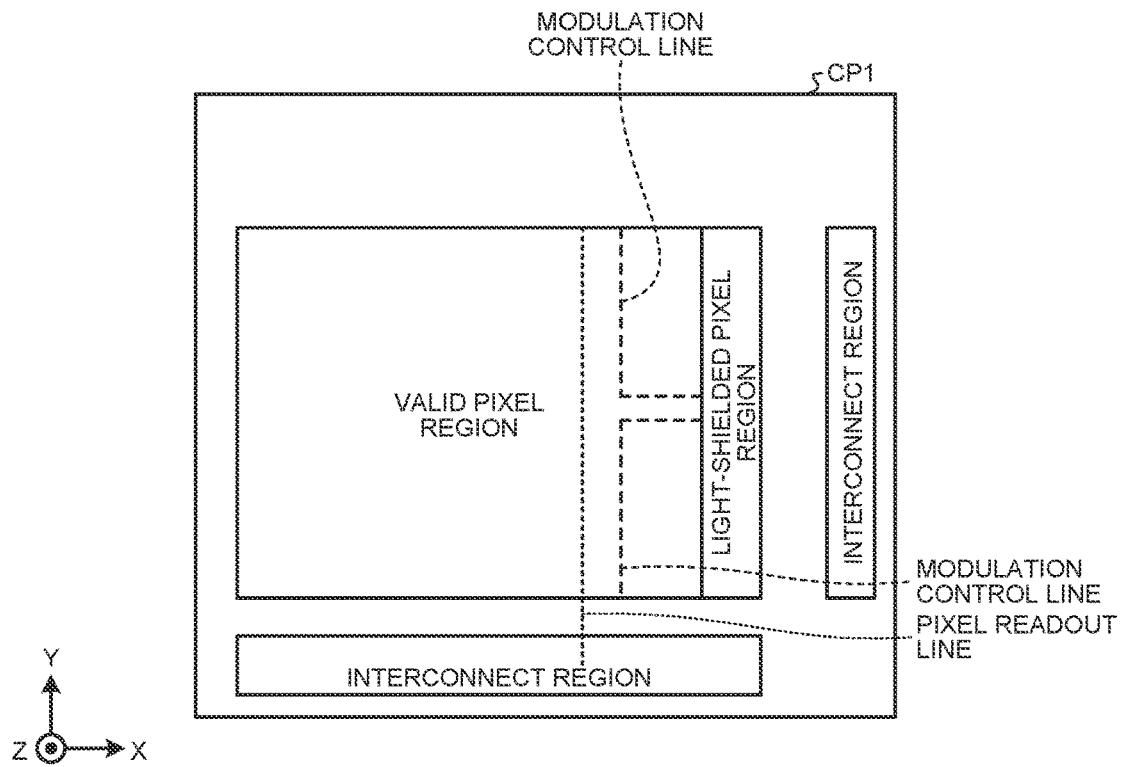
FIG. 31 is a diagram depicting a layout example of the chip.
Figure 32:
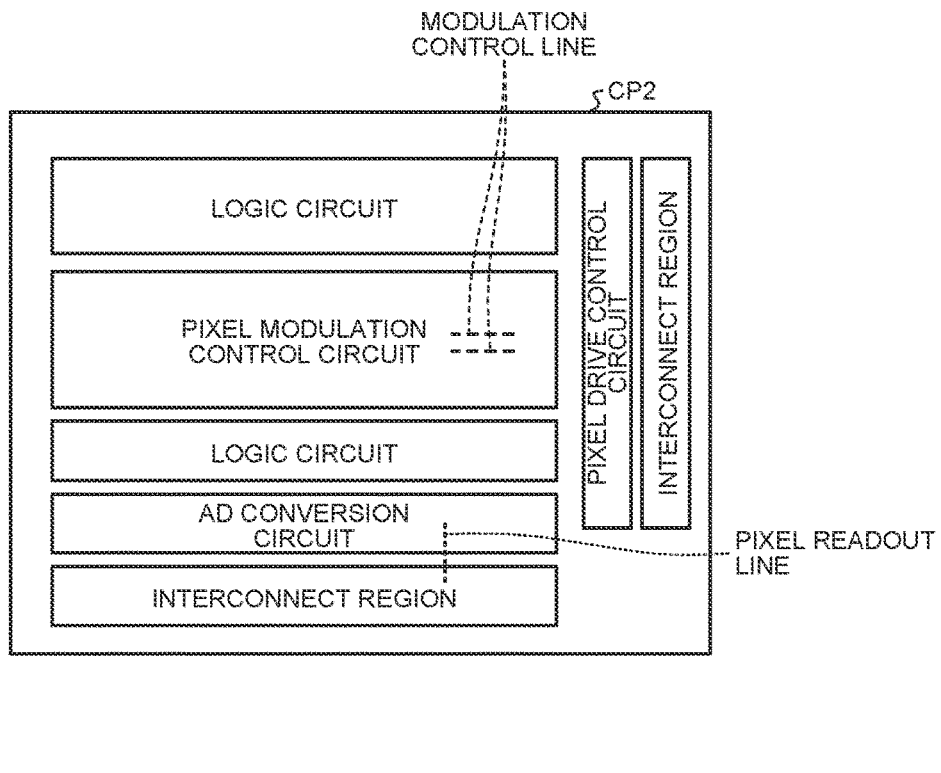
FIG. 32 is a diagram depicting a layout example of the chip.

In the example depicted in FIGS. 31 and 32, in the chip CP1, the modulation control line is divided at the center of the pixel region. In the chip CP2, the pixel modulation control circuit is provided corresponding to the division position of the modulation control line and is connected to the modulation control line by CC connection or the like. Thus, the upper interconnect region as depicted in FIGS. 29 and 30 described above is not needed. Since the modulation control line is divided to reduce the pixel load RC (wiring load RC), high-speed driving is achieved.

Figure 33:
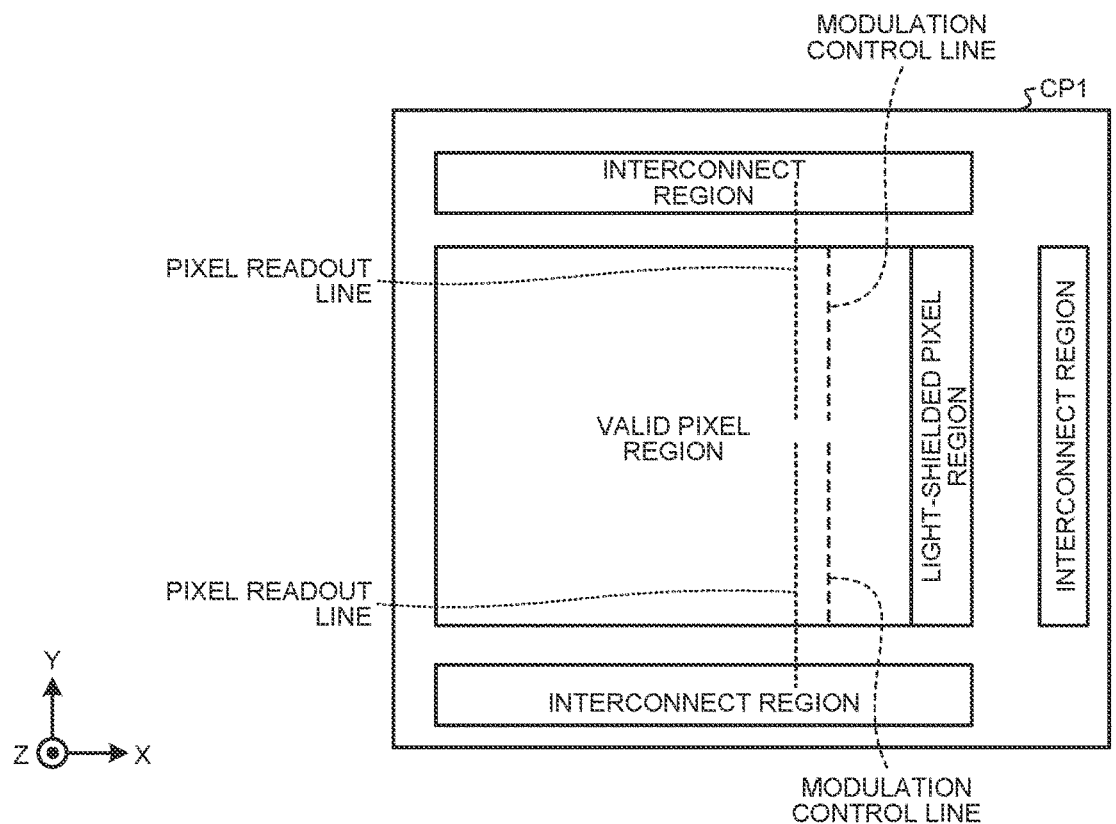
FIG. 33 is a diagram depicting a layout example of the chip.
Figure 34:
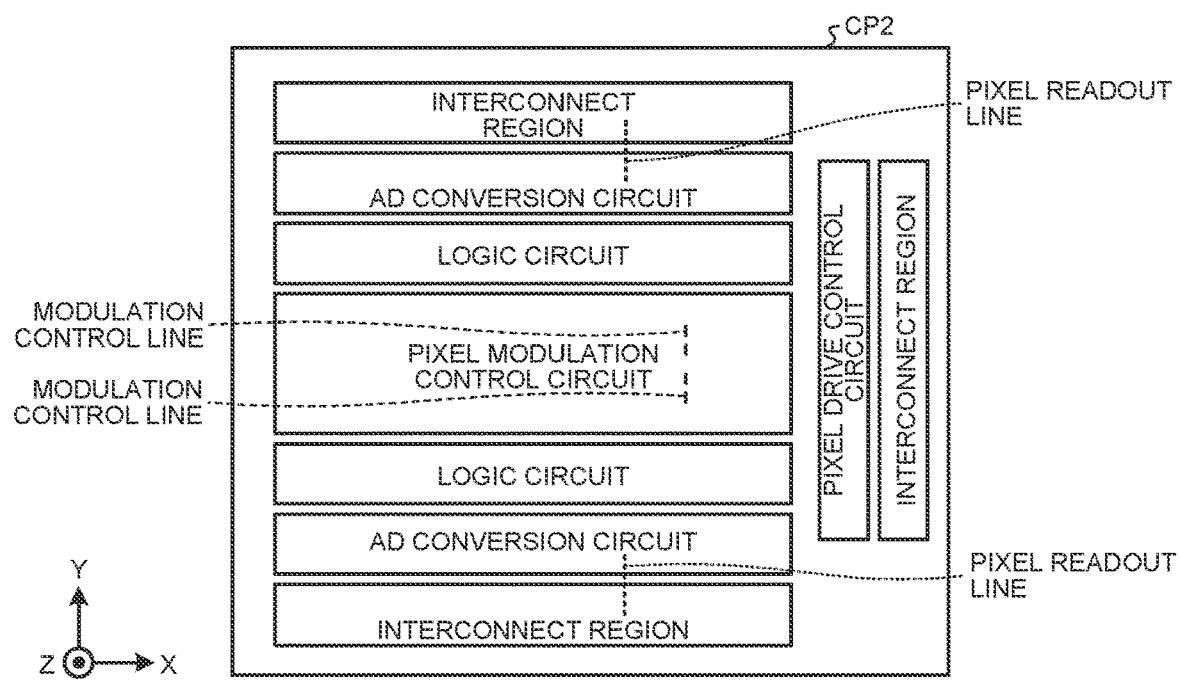
FIG. 34 is a diagram depicting a layout example of the chip.

In the example depicted in FIGS. 33 and 34, in the chip CP1, the pixel readout line is also divided at the center of the pixel region. In the chip CP2, the AD conversion circuit and the logic circuit are provided near the upper interconnect region and the lower interconnect region, respectively. Among the pixel readout lines divided in the chip CP1, the upper pixel readout line is connected to the corresponding AD conversion circuit of the chip CP2 via the upper interconnect region. The lower pixel readout line divided in the CP is connected to the corresponding AD conversion circuit of the chip CP2 via the lower interconnect region. Disposing the AD converters corresponding to the divided pixel readout lines on the upper side and the lower side enables high speed AD conversion.

Figure 35:
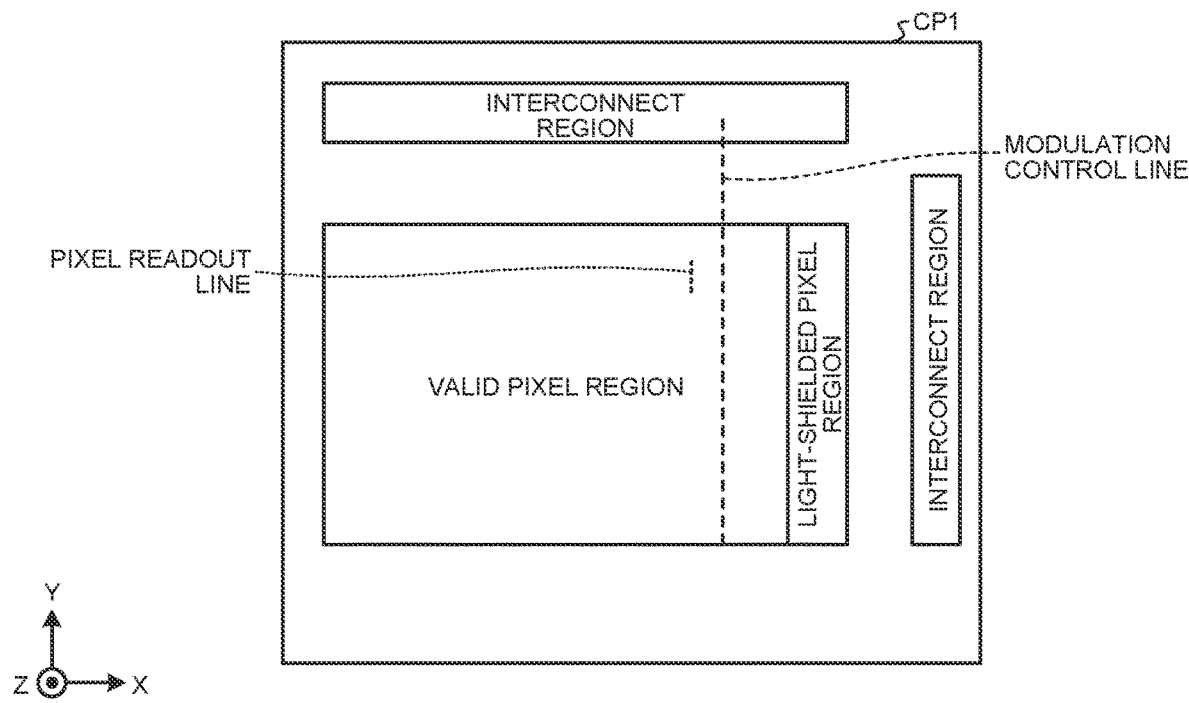
FIG. 35 is a diagram depicting a layout example of the chip.
Figure 36:
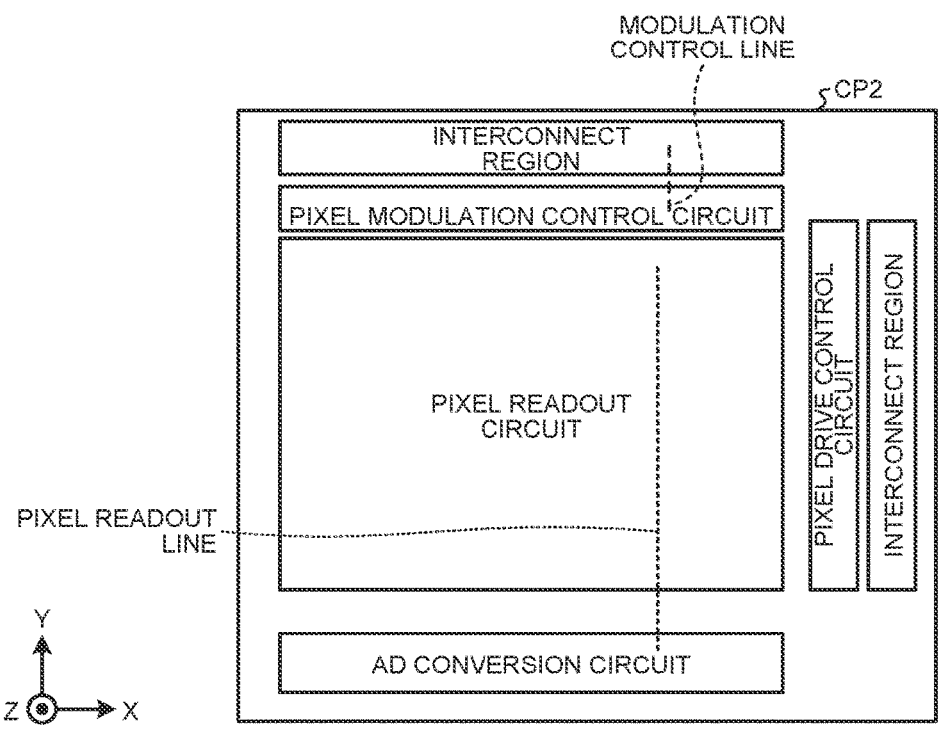
FIG. 36 is a diagram depicting a layout example of the chip.

In the example depicted in FIGS. 35 and 36, the pixel readout circuit is provided at a corresponding position of each pixel in the chip CP2. The readout circuit may include the discharge transistor 13, the transfer transistor 14, the reset transistor 16, the amplification transistor 17, the selection transistor 18, and the like as described above with reference to FIG. 4. The AD conversion circuit is provided near the pixel readout circuit. The pixel readout line is connected from the pixel region of the chip CP1 to the AD conversion circuit via the pixel readout circuit of the chip CP2.

3. Application Example to Mobile Body

The technology according to the present disclosure (present technology) can be applied to various products. For example, the technology according to the present disclosure may be realized as a device mounted on any type of mobile body such as an automobile, an electric vehicle, a hybrid electric vehicle, a motorcycle, a bicycle, a personal mobility, an airplane, a drone, a vessel, and a robot.

Figure 37:
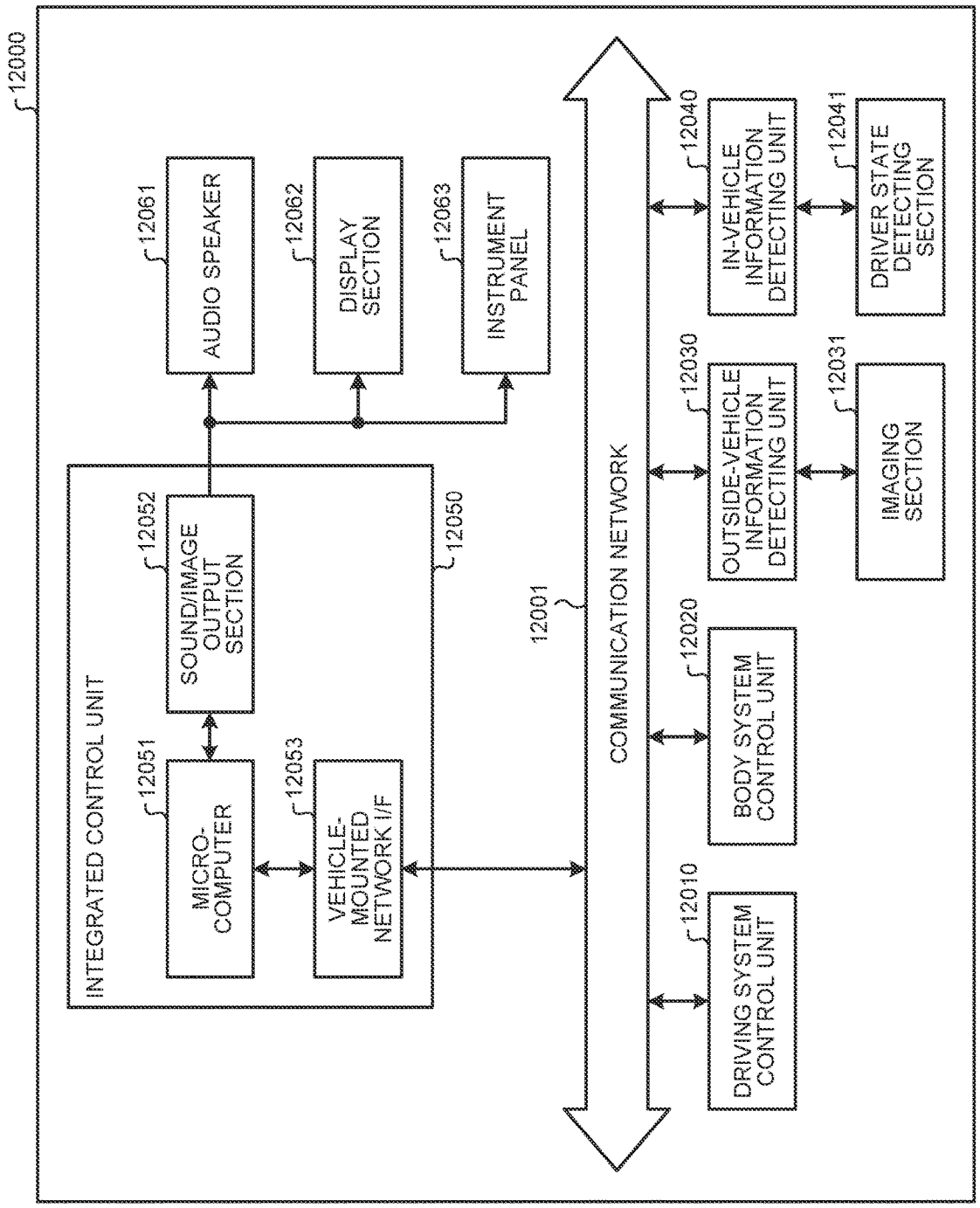
FIG. 37 is a block diagram depicting an example of schematic configuration of a vehicle control system.

FIG. 37 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 37, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 37, an audio speaker 12061, a display section 12062, and an instrument panel 12063 are illustrated as the output device. The display section 12062 may, for example, include at least one of an or board display and a head-up display.

Figure 38:
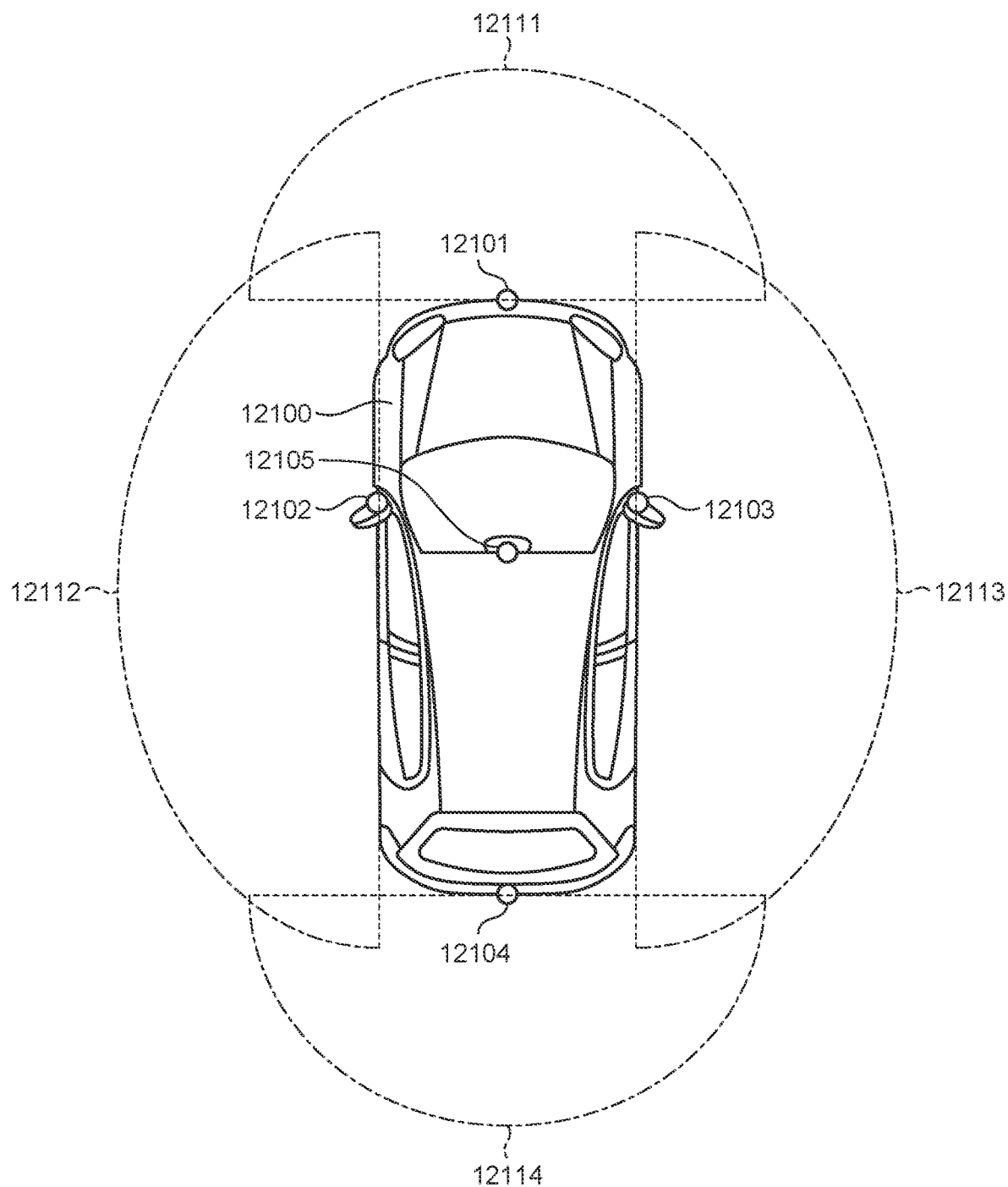
FIG. 38 is a diagram of assistance in explaining an example of installation positions of an outside-vehicle information detecting section and an imaging section.

FIG. 38 is a diagram depicting an example of the installation position of the imaging section 12031.

In FIG. 38, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 38 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure can be applied to the outside-vehicle information detecting unit 12030, the imaging section 12031, or the like among the configurations described above. For example, the distance measuring device 500 acquires image information and distance information about an object outside a vehicle. As a result, for example, it is possible to obtain a more easily viewable captured image in which display variation in the vertical direction is inhibited, and therefore driver's fatigue can be reduced.

4. Effects

The distance measuring device 500 according to the embodiment described above is specified as follows, for example. As described with reference to FIGS. 1 to 9 and other drawings, the distance measuring device 500 includes a plurality of pixels (the valid pixel 11a, the light-shielded pixel 12a, and the like) provided in a row direction (X-axis direction) and a column direction (Y-axis direction), a plurality of AD conversion circuits (the comparison circuit section 6 and the counter section 7) provided in the row direction, each of the plurality of AD conversion circuits performing AD conversion on pixel signals of a corresponding column, and a signal processing section 92 hat generates a depth image signal based on conversion results of the plurality of AD conversion circuits. The plurality of pixels includes a plurality of valid pixels 11a provided in the row direction and the column direction to correspond to the depth image signal, each of the valid pixels 11a including a plurality of charge transfer sections (tap TA and tap TB) that extract pixel signals corresponding to a light amount of incident light in different periods, and a plurality of light-shielded pixels 12a provided in the column direction on at least one of two end sides in the row direction with respect to a region 11 provided with the plurality of valid pixels 11a, each of the plurality of light-shielded pixels 12a being covered with a light-shielding film M.

In the distance measuring device 500 described above, when AD conversion is performed on the pixel signals of the valid pixels 11a in each row, the pixel signals of the light-shielded pixels 12a in the same row can be used as a zero reset signal or used for calculation after AD conversion. This can inhibit variations in AD conversion results between rows, and thus can inhibit display variation in the vertical direction that may occur in a depth image.

As described with reference to FIGS. 2 to 4 and other drawings, each of the plurality of light-shielded pixels 12a may have a structure in which a pixel having the same structure as the valid pixel 11a is covered with the light-shielding film M. As a result, a pixel signal obtained in a case where the valid pixel 11a is shielded from light can be obtained from the light-shielded pixel 12a.

As described with reference to FIGS. 2, 3, and other drawings, the distance measuring device 500 may include a pixel modulation control circuit (the tap driving circuit 2) that generates a modulation signal for controlling extraction of pixel signals by the plurality of charge transfer sections of each of the plurality of valid pixels 11a, and a pixel drive control circuit (the vertical scanning circuit 3 and the horizontal scanning circuit 9) that generates a control signal for reading out the pixel signal of each of the plurality of valid pixels 11a and each of the plurality of light-shielded pixels 12a. As a result, a pixel signal on which pixel modulation control and pixel drive control similar to those of the valid pixel 11a are performed can be obtained from the light-shielded pixel 12a.

As described with reference to FIG. 2 and other drawings, the region 11 provided with the plurality of valid pixels 11a may have a length in the row direction longer than a length in the column direction (portrait-orientated aspect ratio), and the pixel modulation control circuit may be provided in the row direction on at least one of two end sides in the column direction with respect to the region 12 provided with the plurality of light-shielded pixels 12a. The pixel modulation control circuit can be disposed, for example, in this manner.

As described with reference to FIGS. 2, 6, and other drawings, the plurality of AD conversion circuits may include a plurality of comparison circuits 6a provided in the row direction, each of the plurality of comparison circuits 6a comparing pixel signals of the pixels in a corresponding column with the reference signal RAMP, and the plurality of comparison circuits 6a may perform an auto-zero operation using, as a zero reset signal, pixel signals of the light-shielded pixels 12a in a same row as the valid pixels 11a from which pixel signals to be compared with the reference signal RAMP are acquired. It is possible to inhibit variations in AD conversion results between rows and inhibit display variation in the vertical direction in a depth image, for example, in this manner.

Alternatively, as described with reference to FIG. 2 and other drawings, the plurality of AD conversion circuits may collectively perform AD conversion on pixel signals of the plurality of valid pixels 11a and pixel signals of the plurality of light-shielded pixels 12a for each row, and the signal processing section 92 may generate the depth image signal based on a calculation result of pixel signals of the plurality of valid pixels 11a after AD conversion and pixel signals of the plurality of light-shielded pixels 12a after AD conversion. It is possible to inhibit variations in AD conversion results between rows and inhibit display variation in the vertical direction in a depth image in this manner as well.

The plurality of pixels may be provided between the plurality of valid pixels 11a and the plurality of light-shielded pixels 12a, and the plurality of pixels may include a plurality of invalid pixels (the invalid pixel 122a-1 and the like) not connected to the plurality of AD conversion circuits. The light-shielding function in the light-shielded pixel 12a can be enhanced by separating the light-shielded pixel 12a from the valid pixel 11a by the amount of the invalid pixel provided.

As described with reference to FIG. 5 and other drawings, the plurality of invalid pixels may include the invalid pixel 122a-1 (a first invalid pixel) provided adjacent to the light-shielded pixel 12a and having a same structure as a structure of the valid pixel 11a, the invalid pixel 122a-2 (a second invalid pixel) provided adjacent to the light-shielded pixel 12a and having a same structure as a structure of the light-shielded pixel 12a, and the invalid pixel 122a-3 (a third invalid pixel) provided between the invalid pixel 122a-1 and the invalid pixel 122a-2 and having a structure in which a photoelectric conversion section PD is excluded from the structure of the light-shielded pixel 12a. In this manner, by sequentially providing the invalid pixel 122a-1, the invalid pixel 122a-3, and the invalid pixel 122a-3 from the valid pixel 11a toward the light-shielded pixel 12a, it is possible to absorb the structural difference between the structure of the valid pixel 11a and the structure of the light-shielded pixel 12a.

As described with reference to FIGS. 16, 17, and other drawings, the plurality of invalid pixels may include the invalid pixel 122aD-3 or the invalid pixel 122aE-3 provided with the trench section Trnc. This can inhibit incidence of obliquely incident light on the light-shielded pixel 12aC.

As described with reference to FIG. 19 and other drawings, each of the plurality of pixels may include the on-chip lens OCL, and the on-chip lenses OCL of at least some pixels other than the plurality of the valid pixels 11aG may have a shape different from the shape of the on-chip lenses OCL of the plurality of valid pixels 11aG. By allowing such a difference in the shape of the on-chip lens OCL, for example, the yield can be improved.

As described with reference to FIG. 20 and other drawings, the light-shielding film M may be covered with the antireflection film FL. This can reduce an influence caused by reflection of incident light (for example, leakage of light to other pixels).

As described with reference to FIG. 21 and other drawings, the plurality of light-shielded pixels 12a are provided on both sides in the row direction with respect to the region 11 provided with the plurality of valid pixels 11a. This configuration improves, for example, surface uniformity. This configuration also inhibits non-uniformity derived from the power supply difference of the pixels. Since the layout symmetry improves, structural uniformity also improves. The reliability also improves with an increased number of samples of the pixel signal of the light-shielded pixels.

As described with reference to FIG. 28 and other drawings, the distance measuring device 500 may have a stacked structure in which a plurality of semiconductor chips are stacked, wherein the plurality of semiconductor chips may include a first semiconductor chip (the chip CP1) provided with at least some elements of each of the plurality of pixels, and a second semiconductor chip (the chip CP2) provided with at least some of elements other than the elements provided on the first semiconductor chip. The light receiving efficiency can be improved, for example by collecting, in the chip CP1, the photoelectric conversion section and the like among the elements of the pixels and collecting the other elements in the chip CP2.

The effects described in the present disclosure are merely examples and are not limited to the disclosed contents. There may be other effects.

Although the above description is given regarding the embodiments of the present disclosure, the technical scope of the present disclosure is not limited to the above-described embodiments as they are, and various modifications can be made without departing from the scope of the present disclosure. In addition, the components in different embodiments and modifications may be appropriately combined.

The present technology can also have the following configurations.)

(1)

A distance measuring device comprising:
- a plurality of pixels provided in a row direction and a column direction;
- a plurality of AD conversion circuits provided in the row direction, each of the plurality of AD conversion circuits performing AD conversion on pixel signals of a corresponding column; and
- a signal processing section that generates a depth image signal based on conversion results of the plurality of AD conversion circuits, wherein the plurality of pixels include:
- a plurality of valid pixels provided in the row direction and the column direction to correspond to the depth image signal, each of the valid pixels including a plurality of charge transfer sections that extract pixel signals corresponding to a light amount of incident light in different periods; and (1)
a plurality of light-shielded pixels provided in the column direction on at least one or two end sides in the row direction with respect to a region provided with the plurality of valid pixels, each of the plurality of light-shielded pixels being covered with a light-shielding film.

(2)
The distance measuring device according to (1), wherein each of the plurality of light-shielded pixels has a structure in which a pixel having a same structure as the valid pixel is covered with the light-shielding film.

(3)
The distance measuring device according to (1) or (2), the device comprising:
a pixel modulation control circuit that generates a modulation signal for controlling extraction of pixel signals by the plurality of charge transfer sections of each of the plurality of valid pixels; and
a pixel drive control circuit that generates a control signal for reading out a pixel signal of each of the plurality of valid pixels and each of the plurality of light-shielded pixels.

(4)
The distance measuring device according to (3), wherein the region provided with the plurality of valid pixels has a length in the row direction longer than a length in the column direction, and
the pixel modulation control circuit is provided in the row direction on at least one of two end sides in the column direction with respect to the region provided with the plurality of valid pixels.

(5)
The distance measuring device according to any one of (1) to (4), wherein
the plurality of AD conversion circuits include a plurality of comparison circuits provided in the row direction, each of the plurality of comparison circuits comparing pixel signals of the pixels in a corresponding column with a reference signal, and
the plurality of comparison circuits perform an auto-zero operation using, as a zero reset signal, pixel signals of the light-shielded pixels in a same row as the valid pixels from which pixel signals to be compared with the reference signal are acquired.

(6)
The distance measuring device according to any one of (1) to (4), wherein
the plurality of AD conversion circuits collectively perform AD conversion on pixel signals of the plurality of valid pixels and pixel signals of the plurality of light-shielded pixels for each row, and
the signal processing section generates the depth image signal based on a calculation result of pixel signals of the plurality of valid pixels after AD conversion and pixel signals of the plurality of light-shielded pixels after AD conversion.

(7)
The distance measuring device according to any one of (1) to (6), wherein
the plurality of pixels are provided between the plurality of valid pixels and the plurality of light-shielded pixels, and
the plurality or pixels include a plurality of invalid pixels not connected to the plurality of AD conversion circuits.

(8)
The distance measuring device according to (7), wherein each of the plurality of light-shielded pixels has a structure in which a pixel having a same structure as the valid pixel is covered with a light-shielding film, and
the plurality of invalid pixels include:
a first invalid pixel provided adjacent to the valid pixel and having a same structure as a structure of the valid pixel;
a second invalid pixel provided adjacent to the light-shielded pixel and having a same structure as a structure of the light-shielded pixel; and
a third invalid pixel provided between the first invalid pixel and the second invalid pixel and having a structure in which a photoelectric conversion section is excluded from the structure of the light-shielded pixel.

(9)
The distance measuring device according to (7) or (8), wherein
the plurality of invalid pixels include an invalid pixel provided with a trench section.

(10)
The distance measuring device according to any one of (1) to (9), wherein
each of the plurality of pixels includes an on-chip lens, and
the on-chip lenses of at least some pixels other than the plurality of valid pixels have a shape different from a shape of the on-chip lenses of the plurality of valid pixels.

(11)
The distance measuring device according to any one of (1) to (10), wherein
the light-shielding film is covered with an antireflection film.

(12)
The distance measuring device according to any one of (1) to (11), wherein
the plurality of light-shielded pixels are provided on both sides in the row direction with respect to the region provided with the plurality of valid pixels.

(13)
The distance measuring device according to any one of (1) to (12), the device having a stacked structure in which a plurality of semiconductor chips are stacked, wherein
the plurality of semiconductor chips includes:
a first semiconductor chip provided with at least some elements of each of the plurality of pixels; and
a second semiconductor chip provided with at least some of elements other than the elements provided on the first semiconductor chip.

REFERENCE SIGNS LIST

1 PIXEL ARRAY SECTION
2 TAP DRIVING CIRCUIT (PIXEL MODULATION CONTROL CIRCUIT)
3 VERTICAL SCANNING CIRCUIT (PIXEL DRIVE CONTROL CIRCUIT)
4 REFERENCE SIGNAL GENERATION SECTION
5 CONSTANT CURRENT CIRCUIT SECTION
6 COMPARISON CIRCUIT SECTION (AD CONVERSION CIRCUIT)
7 COUNTER SECTION (AD CONVERSION CIRCUIT)
8 REFERENCE SIGNAL GENERATION SECTION
9 HORIZONTAL SCANNING CIRCUIT (PIXEL DRIVE CONTROL CIRCUIT)
11 REGION
11a VALID PIXEL

12 REGION
12a LIGHT-SHIELDED PIXEL
92 SIGNAL PROCESSING SECTION
122a-1 INVALID PIXEL (FIRST INVALID PIXEL)
122a-2 INVALID PIXEL (SECOND INVALID PIXEL)
122a-3 INVALID PIXEL (THIRD INVALID PIXEL)
500 DISTANCE MEASURING DEVICE
502 LIGHT RECEIVING SECTION
CP1 CHIP (FIRST SEMICONDUCTOR CHIP)
CP2 CHIP (SECOND SEMICONDUCTOR CHIP)
FL ANTIREFLECTION FILM
M LIGHT-SHIELDING FILM
OCL ON-CHIP LENS
TA TAP (CHARGE TRANSFER SECTION)
TB TAP (CHARGE TRANSFER SECTION)

The invention claimed is:

1. A distance measuring device comprising:
a plurality of pixels provided in a row direction and a column direction;
a plurality of AD conversion circuits provided in the row direction, each of the plurality of AD conversion circuits performing AD conversion on pixel signals of a corresponding column; and
a signal processor configured to generate a depth image signal based on conversion results of the plurality of AD conversion circuits, wherein
the plurality of pixels include:
a plurality of valid pixels provided in the row direction and the column direction to correspond to the depth image signal, each of the valid pixels including a plurality of charge transfer sections that extract pixel signals corresponding to a light amount of incident light in different periods;
a plurality of light-shielded pixels provided in the column direction on at least one of two end sides in the row direction with respect to a region provided with the plurality of valid pixels, each of the plurality of light-shielded pixels being covered with a light-shielding film;
a pixel modulation control circuit that generates a modulation signal for controlling extraction of pixel signals by the plurality of charge transfer sections of each of the plurality of valid pixels; and
a pixel drive control circuit that generates a control signal for reading out a pixel signal of each of the plurality of valid pixels and each of the plurality of light-shielded pixels.

2. The distance measuring device according to claim 1, wherein each of the plurality of light-shielded pixels has a structure in which a pixel having a same structure as the valid pixel is covered with the light-shielding film.

3. The distance measuring device according to claim 1, wherein
the region provided with the plurality of valid pixels has a length in the row direction longer than a length in the column direction, and
the pixel modulation control circuit is provided in the row direction on at least one of two end sides in the column direction with respect to the region provided with the plurality of valid pixels.

4. The distance measuring device according to claim 1, wherein
the plurality of AD conversion circuits include a plurality of comparison circuits provided in the row direction, each of the plurality of comparison circuits comparing pixel signals of the pixels in a corresponding column with a reference signal, and
the plurality of comparison circuits perform an auto-zero operation using, as a zero reset signal, pixel signals of the light-shielded pixels in a same row as the valid pixels from which pixel signals to be compared with the reference signal are acquired.

5. The distance measuring device according to claim 1, wherein
the plurality of AD conversion circuits collectively perform AD conversion on pixel signals of the plurality of valid pixels and pixel signals of the plurality of light-shielded pixels for each row, and
the signal processor generates the depth image signal based on a calculation result of pixel signals of the plurality of valid pixels after AD conversion and pixel signals of the plurality of light-shielded pixels after AD conversion.

6. A distance measuring device comprising:
a plurality of pixels provided in a row direction and a column direction;
a plurality of AD conversion circuits provided in the row direction, each of the plurality of AD conversion circuits performing AD conversion on pixel signals of a corresponding column; and
a signal processor configured to generate a depth image signal based on conversion results of the plurality of AD conversion circuits, wherein
the plurality of pixels include:
a plurality of valid pixels provided in the row direction and the column direction to correspond to the depth image signal, each of the valid pixels including a plurality of charge transfer sections that extract pixel signals corresponding to a light amount of incident light in different periods; and
a plurality of light-shielded pixels provided in the column direction on at least one of two end sides in the row direction with respect to a region provided with the plurality of valid pixels, each of the plurality of light-shielded pixels being covered with a light-shielding film, wherein
the plurality of pixels are provided between the plurality of valid pixels and the plurality of light-shielded pixels, and
the plurality of pixels include a plurality of invalid pixels not connected to the plurality of AD conversion circuits.

7. The distance measuring device according to claim 6, wherein
each of the plurality of light-shielded pixels has a structure in which a pixel having a same structure as the valid pixel is covered with a light-shielding film, and
the plurality of invalid pixels include:
a first invalid pixel provided adjacent to the valid pixel and having a same structure as a structure of the valid pixel;
a second invalid pixel provided adjacent to the light-shielded pixel and having a same structure as a structure of the light-shielded pixel; and
a third invalid pixel provided between the first invalid pixel and the second invalid pixel and having a structure in which a photoelectric conversion section is excluded from the structure of the light-shielded pixel.

8. The distance measuring device according to claim 6, wherein
the plurality of invalid pixels include an invalid pixel provided with a trench section.

9. A distance measuring device comprising:
a plurality of pixels provided in a row direction and a column direction;
a plurality of AD conversion circuits provided in the row direction, each of the plurality of AD conversion circuits performing AD conversion on pixel signals of a corresponding column; and a signal processor configured to generate a depth image signal based on conversion results of the plurality of AD conversion circuits, wherein
the plurality of pixels include:
a plurality of valid pixels provided in the row direction and the column direction to correspond to the depth image signal, each of the valid pixels including a plurality of charge transfer sections that extract pixel signals corresponding to a light amount of incident light in different periods; and
a plurality of light-shielded pixels provided in the column direction on at least one of two end sides in the row direction with respect to a region provided with the plurality of valid pixels, each of the plurality of light-shielded pixels being covered with a light-shielding film, wherein
each of the plurality of pixels includes an on-chip lens, and
the on-chip lenses of at least some pixels other than the plurality of valid pixels have a shape different from a shape of the on-chip lenses of the plurality of valid pixels.

10. The distance measuring device according to claim 1, wherein
the light-shielding film is covered with an antireflection film.

11. The distance measuring device according to claim 1, wherein
the plurality of light-shielded pixels are provided on both sides in the row direction with respect to the region provided with the plurality of valid pixels.

12. The distance measuring device according to claim 1, the device having a stacked structure in which a plurality of semiconductor chips are stacked, wherein
the plurality of semiconductor chips includes:
a first semiconductor chip provided with at least some elements of each of the plurality of pixels; and
a second semiconductor chip provided with at least some of elements other than the elements provided on the first semiconductor chip.

* * * * *